(12) United States Patent  (10) Patent No.: US 7,075,475 B1
Wan  (45) Date of Patent: Jul. 11, 2006

(54) CORRELATED DOUBLE SAMPLING MODULATION SYSTEM WITH REDUCED LATENCY OF REFERENCE TO INPUT

(75) Inventor: Jun Wan, Wilmington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/917,779

(22) Filed: Aug. 13, 2004

(51) Int. Cl.
  *H03M 1/12* (2006.01)
  *H03M 3/00* (2006.01)
  *G06F 7/64* (2006.01)
  *G06G 7/18* (2006.01)
  *G06G 7/19* (2006.01)

(52) U.S. Cl. ................... 341/172; 341/143; 327/337

(58) Field of Classification Search ............. 341/144, 341/143, 136, 150, 118, 120, 172; 324/712, 324/99 D; 348/250, 241, 308; 374/170; 327/94, 337; 370/484; 330/9
  See application file for complete search history.

(56) References Cited

U.S. PATENT DOCUMENTS

| | | | | |
|---|---|---|---|---|
| 3,816,825 A | * | 6/1974 | Kaneko et al. | 341/118 |
| 4,035,629 A | * | 7/1977 | Lampe et al. | 702/193 |
| 4,072,939 A | * | 2/1978 | Heller et al. | 341/133 |
| 4,096,451 A | | 6/1978 | Pradal | |
| 4,117,722 A | | 10/1978 | Helmstetter | |
| 4,250,494 A | * | 2/1981 | Butler et al. | 341/136 |
| 4,287,441 A | * | 9/1981 | Smith | 327/94 |
| 4,375,059 A | * | 2/1983 | Schlig | 341/162 |
| 4,939,516 A | | 7/1990 | Early | |
| 5,086,344 A | * | 2/1992 | D'Luna et al. | 348/250 |
| 5,159,341 A | | 10/1992 | McCartney et al. | |
| 5,461,381 A | | 10/1995 | Seaberg | |
| 5,675,334 A | | 10/1997 | McCartney | |
| 5,691,720 A | | 11/1997 | Wang et al. | |
| 5,736,886 A | * | 4/1998 | Mangelsdorf et al. | 327/310 |
| 5,760,723 A | * | 6/1998 | McGrath et al. | 341/143 |
| 5,841,310 A | | 11/1998 | Kalthoff et al. | |

(Continued)

FOREIGN PATENT DOCUMENTS

GB  2031193 A  4/1980

(Continued)

OTHER PUBLICATIONS

Jacques Robert et al., "A 16-Bit Low-Voltage CMOS A/D Converter," IEEE Journal of Solid-State Circuits, vol. SC-22, No. 2, Apr. 1987, pp. 157-163, no date.

(Continued)

*Primary Examiner*—Patrick Wamsley
(74) *Attorney, Agent, or Firm*—Patent Law Group LLP; Carmen C. Cook

(57) ABSTRACT

A charge balancing modulation system for digitizing the output of a variable impedance sensor utilizes synchronous excitation of the input sensor and AC coupling of the analog input signal. In one embodiment, the modulation system includes a switched excitation source for exciting the input sensor and generating an input voltage step in response, and an integrator including an input capacitor, an amplifier and an accumulation capacitor. The input capacitor AC couples the input voltage step to the integrator to form an input charge. A reference charge packet is generated in a data dependent manner and coupled to the integrator simultaneously with the input charge. The integrator integrates charge associated with the sum of the input charge and the reference charge, when applied. The modulation system generates an output data stream exhibiting a ones density proportional to the magnitude of the average input voltage step.

33 Claims, 5 Drawing Sheets

U.S. PATENT DOCUMENTS

| | | |
|---|---|---|
| 5,870,048 A | 2/1999 | Kuo et al. |
| 5,936,433 A | 8/1999 | Holloway |
| 5,982,221 A | 11/1999 | Tuthill |
| 5,982,315 A | 11/1999 | Bazarjani et al. |
| 6,008,685 A | 12/1999 | Kunst |
| 6,018,364 A * | 1/2000 | Mangelsdorf ............... 348/241 |
| 6,019,508 A | 2/2000 | Lien |
| 6,028,472 A | 2/2000 | Nagumo |
| 6,037,887 A | 3/2000 | Wu et al. |
| 6,064,054 A | 5/2000 | Waczynski et al. |
| 6,097,239 A | 8/2000 | Miranda, Jr. et al. |
| 6,118,326 A | 9/2000 | Singer et al. |
| 6,147,550 A | 11/2000 | Holloway |
| 6,147,631 A | 11/2000 | Maulik et al. |
| 6,160,393 A | 12/2000 | Ahn et al. |
| 6,242,974 B1 | 6/2001 | Kunst |
| 6,320,616 B1 * | 11/2001 | Sauer .......................... 348/241 |
| 6,332,710 B1 | 12/2001 | Aslan et al. |
| 6,411,242 B1 | 6/2002 | Oprescu et al. |
| 6,463,566 B1 * | 10/2002 | Paul .............................. 716/1 |
| 6,587,144 B1 * | 7/2003 | Kim ............................ 348/241 |
| 6,609,419 B1 | 8/2003 | Bankart et al. |
| 6,674,185 B1 | 1/2004 | Mizuta |
| 6,727,486 B1 * | 4/2004 | Choi ....................... 250/208.1 |
| 6,750,796 B1 | 6/2004 | Holloway et al. |
| 6,753,913 B1 * | 6/2004 | Bilhan et al. ................ 348/241 |
| 6,869,216 B1 * | 3/2005 | Holloway et al. .......... 374/170 |
| 6,903,558 B1 * | 6/2005 | Blom et al. .................. 324/712 |
| 6,930,495 B1 * | 8/2005 | Blom et al. .................. 324/712 |
| 6,956,411 B1 * | 10/2005 | Holloway ..................... 327/94 |
| 6,956,515 B1 * | 10/2005 | Keehr et al. ................. 341/150 |
| 6,962,436 B1 * | 11/2005 | Holloway et al. .......... 374/170 |
| 6,975,103 B1 * | 12/2005 | Blom ........................ 324/99 D |

FOREIGN PATENT DOCUMENTS

JP          55000476          1/1980

OTHER PUBLICATIONS

Anton Bakker et al., "MIcropower CMOS Temperature Sensor with Digital Output," IEEE Journal of Solid-State Circuits, vol. 31, No. 7, Jul. 1996, no date.

* cited by examiner

CORRELATED DOUBLE SAMPLING MODULATION SYSTEM WITH REDUCED LATENCY OF REFERENCE TO INPUT

FIELD OF THE INVENTION

The invention relates to a modulation system for variable impedance sensor analog to digital conversion applications. In particular, the invention relates to an AC coupled modulation system which implements synchronous rectification, correlated double sampling and reduced latency of reference signal to input signal.

DETAILED DESCRIPTION OF THE PREFERRED EMBODIMENTS

Figure 1:
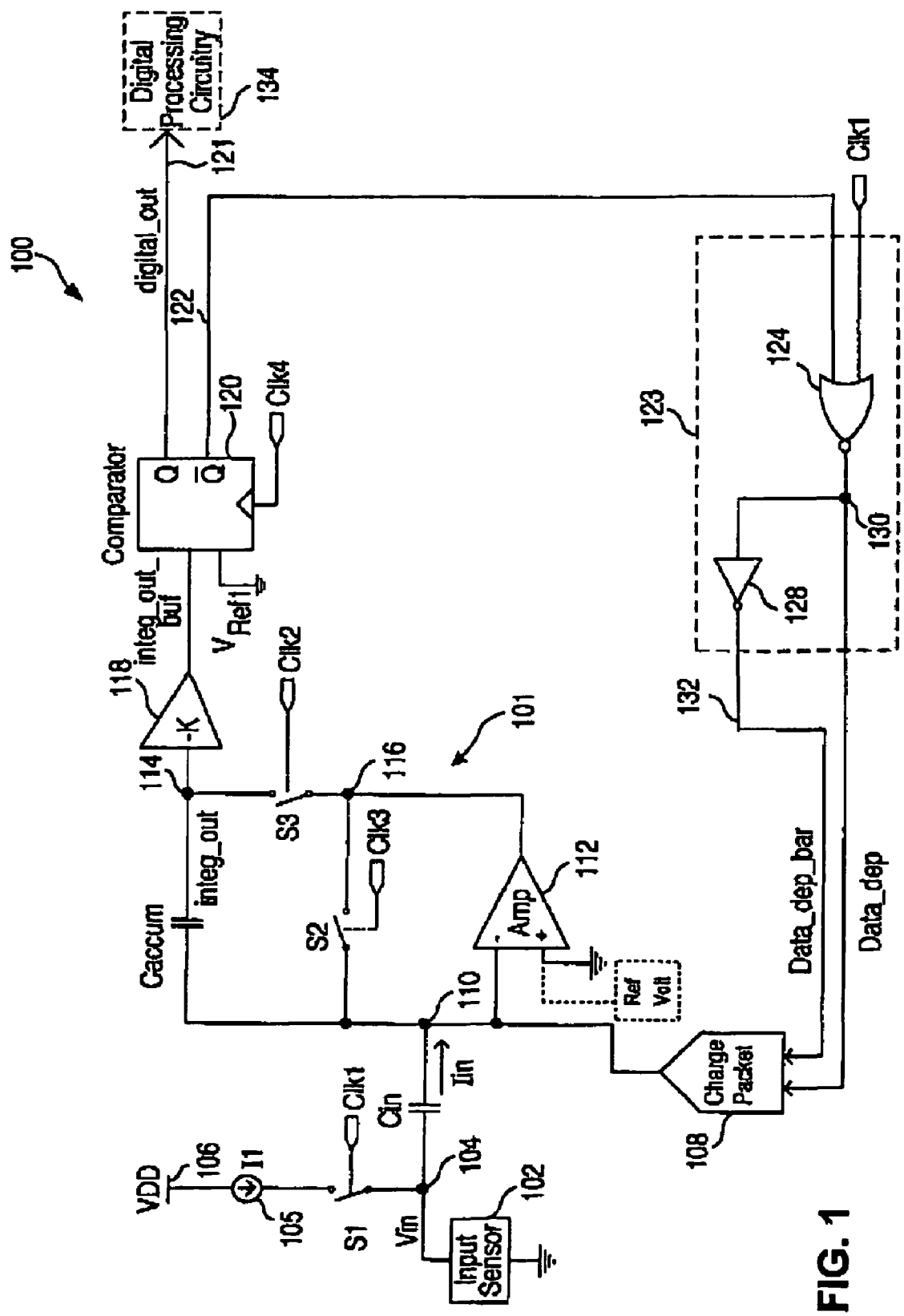
FIG. 1 is a schematic diagram of a charge balancing modulation system according to one embodiment of the present invention.

In accordance with the principles of the present invention, a charge balancing modulation system for digitizing an analog input signal generated by a variable voltage or impedance sensor utilizes synchronous excitation of the input sensor and AC coupling of the analog input signal. Furthermore, the modulation system implements data dependent reference signal generation and correlated double sampling to provide low noise and highly accurate analog-to-digital conversions. In operation, the modulation system generates an input voltage step, indicative of the value of the analog input signal, and a data dependent reference charge packet having reverse polarity that are simultaneously coupled to an integrator of the modulation system for data dependent charge accumulation. The modulation system generates an output data stream having an ones density that is proportional to the magnitude of the average input voltage step as compared to a reference voltage. The modulation system can be operated using a four or fewer phase clocking scheme thereby reducing the latency from the reference signal to the input signal.

In one embodiment, the modulation system includes an excitation source for providing a switched current to an input sensor and generating an input voltage step in response. The modulation system also includes a reference source which is controlled by data dependent switches to generate, in a data dependent manner, a reference charge packet having opposite polarity. The modulation system includes an integrator for receiving the input voltage step and the reference charge packet. The integrator includes an input capacitor, an amplifier and an accumulation capacitor. The input capacitor AC couples the desired input voltage step synchronously with the excitation of the input sensor to generate an input charge packet. The input charge packet and the data dependent reference charge packet are simultaneously coupled to the integrator to effectuate charge balancing. The integrator is controlled by switches operating in complementary state for enabling correlated double sampling operation in one state and for enabling data dependent charge accumulation in another state. During the correlated double sampling phase, the other undesired edge of the input signal is absorbed by the integrator held in reset, which avoids any charge from the undesired edge from reaching capacitor Caccum and its resulting output voltage node "integ_out". The modulation system generates an output data stream having an ones density proportional to the magnitude of the average input voltage step as compared to the reference charge packet.

In the following description, the term "a reference voltage step Vdac" is used to refer to the voltage waveform that is used to generate the reference charge packet. It is instructive to note that the modulation system of the present invention operates in the charge domain to accumulate charge and therefore the modulation system requires only the generation of a reference charge packet. A reference voltage step or waveform is not always necessary for the generation of the reference charge packet. Methods for generating the reference charge packet without using a reference voltage step can also be used in the modulation system of the present invention for providing the reference charge packet. The use of a "reference voltage step Vdac" in the following description is illustrative only.

In accordance with the present invention, a modulation system incorporates a synchronous excitation source for exciting a sensor and a modulator for sampling and digitizing the analog input signals generated by the sensor. The modulation system of the present invention realizes synchronous detection by performing sensor excitation phase-locked to the sampling function of the modulator. In an alternate embodiment, the modulator of the modulation system can be operated as a stand alone modulator receiving analog input signals from an excitation source driving a sensor. In that case, synchronous detection can be realized by synchronizing the operation of the excitation source with the operation of the modulator using known synchronization schemes, such as a phaselocked loop.

The modulation system of the present invention can be incorporated into an analog-to-digital converter (ADC) for digitizing analog input signals generated by an impedance varying sensor, such as a varying-resistance sensor or a silicon diode temperature sensor, where the sensor's response to the intended stimulus corresponds to a change in the resistive or the "real" portion of the sensor's impedance. In the present description, sensors or input sensors are defined as circuit elements which exhibit some observable, measurable change in their electrical characteristics in response to the stimulus to be measured. The modulation system of the present invention is designed for use in measuring and digitizing the output signal of a sensor which exhibits a change in the resistive or the real portion of its impedance in response to its sensed stimulus. That is, the modulation system of the present invention can be operated with many different types of impedance varying sensors. Examples of sensors that vary the real part of their impedance in response to external stimulus include resistive thermal devices, thermistors, silicon diode temperature sensors, piezoresistive pressure sensors and resistive displacement sensors. As is well understood by one skilled in the art, impedance Z can be expressed in rectangular form as Z=R+jX where R denotes the resistive component and X denotes the reactive component of the impedance. Thus, in the present description, the "resistive" or "real" portion of an impedance refers to the resistive component "R" of the impedance as expressed in the equation above.

According to one aspect of the present invention, the modulation system can be incorporated in an incremental or a delta-sigma ADC for sampling and digitizing analog signals generated at an impedance-varying input sensor in response to its stimulus. In general, both a delta-sigma ADC and an incremental ADC include a delta-sigma ($\Delta\Sigma$) modulator as the analog front end and digital post processing circuitry as the digital back end. The modulator samples the analog input signal, such as an input voltage generated by the input sensor, and generates a single bit digitized data stream having an ones density representative of the magnitude of the analog input signal. The digital post processing circuitry of a delta-sigma ADC may include filters, while the digital post processing circuitry of an incremental ADC may include counters, each for processing the ones density data stream. Each post processing circuit thereby generates a single digital value indicative of the relative frequency of occurrence of the many logical "1" values in the digitized data stream within some time interval. The single digital value is therefore an estimate of the average magnitude of the analog input signal during that time interval.

Modulation System Overview

FIG. 1 is a schematic diagram of a charge balancing modulation system according to one embodiment of the present invention. Referring to FIG. 1, modulation system 100 is configured to sample and digitize an analog input signal generated across an input sensor 102. In the present illustration, the analog input signal is an input voltage step Vin coupled to an input node 104 of the modulation system.

Modulation system 100 of the present invention employs synchronous excitation of the input sensor. Thus, input voltage step Vin is generated and sampled at predetermined, fixed time intervals. In the present embodiment, synchronous excitation of the input sensor is realized by the continuous time switching of an excitation current I1 provided to the input voltage node. Referring to FIG. 1, synchronous excitation of input sensor 102 is effectuated by switching current I1, provided by a current source 105, through the action of a switch S1 controlled by a clock signal Clk1.

As mentioned above, the modulation system of the present invention can be applied to sample and digitize a variety of analog signal sources. Thus, input sensor 102 represents a sensing element suitable for the parameter being measured. The implementation of the switching excitation source of modulation system 100 may differ depending on the parameters being measured, as will be described in more detail below. The switching excitation current circuit of FIG. 1 is illustrative only and is not intended to be limiting. For instance, in the embodiment shown in FIG. 1, the switching excitation current circuit provides an excitation current that changes from zero current (when switch S1 is open) to a positive current value (when switch S1 is closed). In other embodiments, the switching excitation current circuit can provide an excitation current that changes from a first current value to a second, higher current value. Alternately, the switching excitation current circuit can provide an excitation current that changes from a first current value to a second, lower current value. In yet another embodiment, the excitation source may be an excitation voltage circuit providing a first voltage value and a second higher (or lower) voltage value.

Modulation system 100 includes an integrator 101 for receiving input voltage step Vin on node 104 and a data dependent reference charge packet generated by a charge packet generator circuit 108 and integrating the charge associated with the sum in the step change in voltage Vin and the reference charge packet. In the present embodiment, integrator 101 of modulation system 100 is formed by an input capacitor Cin, an operational amplifier 112 and an accumulation capacitor Caccum. Input capacitor Cin is coupled between input node 104 and a node 110 which is the inverting input terminal of amplifier 112. The non-inverting input terminal of amplifier 112 is connected to the ground potential but it can also be connected to any reference potential, as shown by the alternate connection of the dotted line and the dotted box in FIG. 1. A switch S2, controlled by a clock signal Clk3, is connected between the inverting input terminal (node 110) and the output terminal (node 116) of amplifier 112. When switch S2 is closed, a short-circuited negative feedback loop is formed around amplifier 112 and integrator 101 is in an inactive mode. Assuming switch S3 has been open, no change in voltage at the output voltage node integ_out of integrator 101 (node 114) can occur.

Accumulation capacitor Caccum is switchably connected across amplifier 112. Specifically, one terminal of capacitor Caccum is always connected to the inverting input terminal (node 110) of amplifier 112 while the other terminal of capacitor Caccum is conditionally connected to the output terminal (node 116) of amplifier 112 through a switch S3. Switch S3 is controlled by a clock signal Clk2. When switch S3 is closed, capacitor Caccum is connected in the negative feedback loop of amplifier 112 and integrator 101 is in an active mode. When switch S3 is open, capacitor Caccum is disconnected from amplifier 112 and integrator 101 is in an inactive mode whereby the voltage across and the charge stored on capacitor Caccum are not affected by the operation of amplifier 112. Clock signals Clk2 and Clk3 are complementary clock signals. Therefore, switch S2 and switch S3 operate in a complementary fashion (one switch closes while another opens) such that integrator 101 is either active (amplifier 112 connected to capacitor Caccum by action of switch S3) or inactive (amplifier 112 shorted by action of switch S2).

Modulation system 100 is an AC coupled system such that only non-static changes in the input voltage generated by the input sensor (input voltage step Vin) are measured and coupled to the integrator. In operation, input voltage step Vin changes in response to the application of switched current I1 through the switching action of switch S1. Capacitor Cin couples the voltage change in voltage step Vin ($\Delta$Vin) to the inverting input terminal (node 110) of amplifier 112. Specifically, the input signal to the modulation system is a current Iin consisting of discrete packets of charge associated with voltage changes at voltage Vin. In the present illustration, the input charge packets generated are associated with the negative-going transitions at voltage Vin that occur at a rate of one charge packet per sampling cycle. The negative-going-voltage-step input charge packet is to be balanced out with a positive-going-voltage-step reference charge packet, as will be explained in more detail below. In other embodiments, the input charge packets can be generated based on the positive-going voltage steps of voltage Vin, as long as the polarity of the reference charge packet is modified accordingly.

The manner in which a discrete charge packet is produced by the application of the stepped excitation current I1 and by the AC coupling of the resultant analog input signal through input capacitor Cin is described as follows. For an ideal voltage step from any DC voltage V1 to a larger DC voltage V2 generated by a voltage source of output impedance R, a current flowing into a capacitor Cin is given by:

$$i(t) = \frac{\Delta V}{R} e^{\frac{-t}{RC_{in}}},$$

where ΔV is (V2−V1) and Cin represents the capacitance of input capacitor Cin. The charge transferred through capacitor Cin is given by:

$$q(t) = C_{in} \Delta V (1 - e^{-t/RC_{in}}).$$

If the input voltage step is allowed to persist for a time much, much longer than the time constant RCin, then the input current decays to very nearly zero and the charge transfer settles such that almost all the charge is transferred through capacitor Cin. The transferred charge is given by:

$$Q_{in} = C_{in} \Delta V$$

where the charge Qin is transferred through Cin to ground. In modulation system 100, the charge Qin is transferred through Cin to node 110 which is a virtual ground node of amplifier 112. The above description applies for a positive-going voltage step. In the case where a negative-going voltage step is involved, that is, a voltage step from a DC voltage V1 to a smaller DC voltage V2, a negative charge packet of magnitude −Qin will be defined in the same manner as described above.

In modulation system 100, either the positive-going transition or the negative-going transition of the input signal, but not both, is used as the input signal to the modulator. While it might be possible in some circumstances to implement an input excitation source which only generates a positive or a negative voltage/current step at the input sensor, a more useful excitation source produces a repetitive flat topped pulse which returns to a lower value between each positive step, or vice versa. As will be described in detail below, in a preferred embodiment of the present invention, the excitation source generates at the input sensor a repetitive flat topped pulse between a first voltage level and a second lower voltage level which is the input waveform. The negative-going voltage steps of the input voltage pulses are used to drive the AC coupling input capacitor to generate the input charge packets.

In modulation system 100, it is possible to use a repetitive pulse excitation source to generate the input charge packets because the modulator is operated to integrate only charge packets from the positive-going voltage steps and ignore the charge packets from the negative-going voltage steps, or vice versa. The modulation system operates to discard the charge packets associated with the unwanted transitions of the voltage steps by disconnecting capacitor Caccum from amplifier 112 during portions of the input waveform where the unwanted transitions occur. In the present illustration, the accumulation capacitor Caccum is disconnected from amplifier 112 during the positive-going transition of the input voltage pulse. Therefore, the positive charge is not accumulated but instead is dissipated by the amplifier output circuits. Because the integrator ignores the charge transferred during the positive transition of the input pulse, modulation system 100 is able to use an easily generated repetitive pulse as the input excitation source. This operation is also known as "synchronous integration". In alternate embodiments, the positive-going transition can be used to generate the input charge packet and the negative-going transition of the input pulse from the excitation source can be accordingly ignored.

A charge transfer of magnitude Qin which repetitively occurs at a sampling cycle period T defines an input current given by:

$$I_{in} = \frac{Q_{in}}{T} = \frac{C_{in} \Delta V}{T}.$$

In the following descriptions, it is assumed that the flat portions of input voltage Vin at input capacitor Cin are of sufficiently long time interval and the clock frequency of the excitation source is low enough that the approximation that Qin=CinΔV produces insignificant errors. The magnitude of charge Qin derived by the AC coupling of the step input voltage is a function of the capacitance of input capacitor Cin and the magnitude of the voltage change at input voltage Vin. More importantly, the magnitude of the charge Qin is independent of the DC voltage level at Vin.

By virtue of using AC coupling of the input voltage, the DC voltage level of input voltage Vin is irrelevant to the operation of the modulation system. Therefore, the modulation system of the present invention can be advantageously applied to measure small synchronous ΔVin amplitudes even when superimposed upon a large DC common mode voltage. For example, the modulation system of the present invention can be used to measure step voltage amplitudes as small as 10 micro-volts superimposed upon a common mode DC baseline voltage as large as 1000 volts. This type of precision measurement cannot be easily achieved by conventional DC coupled modulation systems. In a DC coupled modulation system, a large DC voltage at the input terminal can saturate the input range of the amplifier and clip the output response of the amplifier. As a result, a small amplitude ΔVin in the presence of a large baseline voltage cannot be measured in the conventional DC coupled systems without the use of additional input AC coupling circuitry.

Based on the control of clock signals Clk1, Clk2 and Clk3, integrator 101 uses gated continuous time integration to accumulate charge from the input voltage step. The use of gated continuous time integration has the effect of bandlimiting any wideband noise applied to the analog input terminal of integrator 101 or generated by the reference charge packet circuit (circuit 108 to be described below). Thus, the modulation system of the present invention is capable of achieving enhanced noise reduction as compared to conventional systems using switched capacitors to sample voltage and then accumulate charge at the analog input terminal. In effect, the gated continuous time integrator can and does function as its own anti-aliasing filter, due to the absence of switched capacitors in its signal path.

To implement charge balancing in modulation system 100, integrator 101 receives a periodic, data dependent reference charge packet from a charge packet generator circuit 108 which reference charge packet is used to balance the charge accumulated from input voltage step Vin. The application of the reference charge packet to the inverting input terminal (node 110) of amplifier 112 is controlled by clock signal Clk1 so that the application of the input voltage step Vin and the reference charge packet occur simultaneously.

Figure 2:
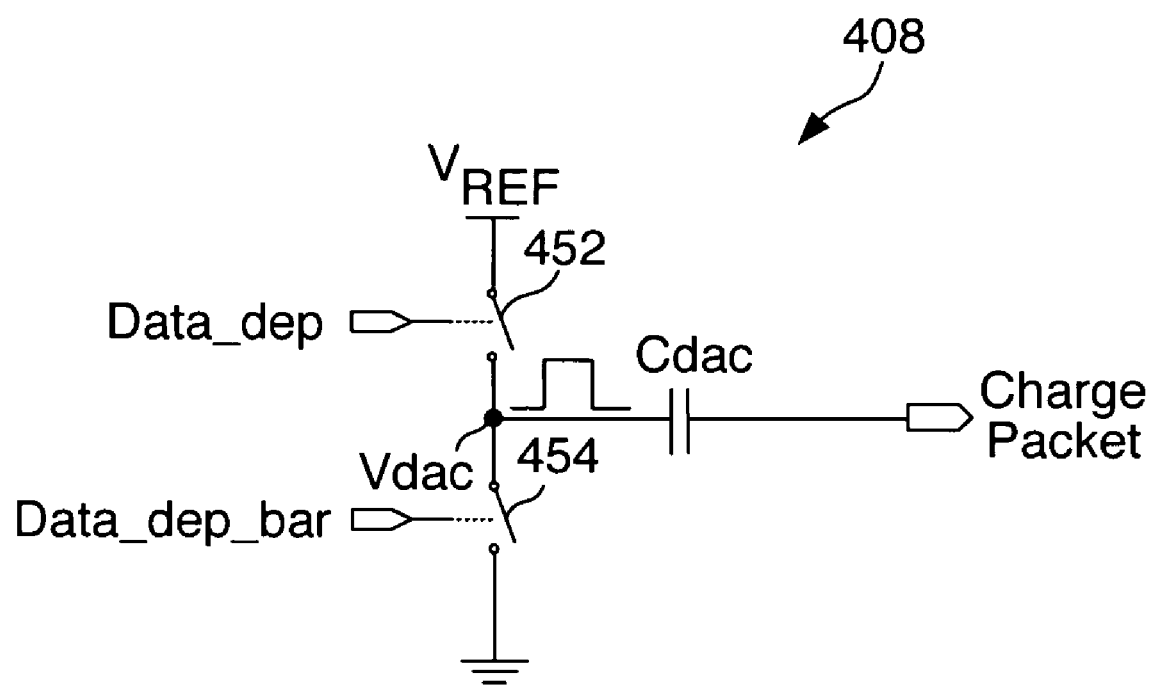
FIG. 2 is a schematic diagram of a charge packet generator circuit according to one embodiment of the present invention which can be incorporated in the modulation system of FIG. 1.

Charge packet generator circuit 108 can be implemented using any means, conventional or to be developed, for generating a given amount of charge within a given time period in a data dependent manner. Typically, a voltage pulse Vdac coupled to a capacitor is used to generate a reference charge packet. FIG. 2 is a schematic diagram of a charge packet generator circuit according to one embodiment of the present invention which can be incorporated in the modulation system of FIG. 1. Referring to FIG. 2, charge packet generator circuit 408 includes a pair of serially connected switches 452 and 454 connected between a reference voltage $V_{REF}$ and the ground potential. Switches 452 and 454 are controlled by a data dependent (Data_dep) signal and its inverse (Data_dep_bar), respectively. Data_dep signal and Data_dep_bar signal are complementary. Thus, one switch is open when the other is closed. The common node between switches 452 and 454, having a voltage Vdac, is coupled to a capacitor Cdac.

In operation, due to the complementary switching action of switches 452 and 454, voltage Vdac swings from the ground potential to voltage $V_{REF}$ and vice versa at the clock frequency of the data dependent signals and depending on the value of the data dependent signals (Data_dep and Data_dep_bar). As will be explained in more detail below, the data dependent signals are controlled by clock signal Clk1 in the present embodiment. Therefore, any voltage pulses generated by the switching action of switches 452 and 454 will be at the clock frequency of clock Clk1. Voltage Vdac at the common node of switches 452 and 454 is thus a voltage waveform where a voltage pulse is either present or absent in each clock period of clock Clk1. When a voltage pulse is generated at voltage Vdac, the voltage pulse charges the left plate of capacitor Cdac and a reference charge packet, proportional to voltage $V_{REF}$, is accordingly generated at the right plate of capacitor Cdac.

Returning to FIG. 1, the output voltage integ_out of integrator 101 (at node 114) is coupled to a buffer 118. Buffer 118 is used to present a high impedance input to capacitor Caccum such that no loading is placed on capacitor Caccum. In the present embodiment, buffer 118 has a gain of K. Thus, the output voltage integ_out_buf from buffer 118 is equal to K times the input voltage integ_out. In one embodiment, buffer 118 is a unity gain buffer. In another embodiment, buffer 118 can have a negative gain (−K) so that the buffer operates to amplify and invert the voltage polarity of the input voltage.

After buffer 118, the voltage integ_out_buf is coupled to a comparator 120 comparing the voltage integ_out_buf with a reference voltage $V_{Ref1}$. If voltage integ_out_buf value is greater than voltage $V_{Ref1}$, comparator 120 generates a logical "1" as the output signal. If voltage integ_out_buf is less then $V_{Ref1}$, comparator 120 generates a logical "0" as the output signal. Comparator 120 is controlled by clock signal Clk4 such that comparisons are triggered on the rising edge of clock signal Clk4 and the comparator outputs Q and $\overline{Q}$ are valid for at least the duration of clock signal Clk4. In the present embodiment, voltage $V_{Ref1}$ is the ground potential. In other embodiments, voltage $V_{Ref1}$ can be the logical threshold level of the inverter gate in the comparator or any other desirable threshold value.

The output signal digital_out from comparator 120 is a single bit digital data stream on terminal 121 which data stream can then be provided to a digital processing circuitry 134 for filtering and determining the digital value thereof. In the present embodiment, the digital_out signal has an ones density that is proportional to the average amplitude of the input voltage step Vin due to the switched current excitation over the time period examined as compared to the reference charge packet.

In modulation system 100, the analog output signal from the integrator 101 is taken directly from the accumulation capacitor Caccum, which is continuously connected, without any series switches, to integrator output node 114. In conventional modulation systems, the output signal is typically taken from the output terminal of the amplifier. While the accumulation capacitor Caccum is disconnected from amplifier 112 by the action of opening switch S3, capacitor Caccum remains connected to the output node 114 and the analog output signal integ_out remains valid. The integ_out signal can be used by the subsequent analog stages even during the time interval when the integrator amplifier is shorted input-to-output through switch S2 for correlated double sampling. Maintaining a valid signal during the correlated double sampling time can reduce the number of clock phases required for the modulation system operation and make possible the pipelined implementation of buffer 118 or comparator 120.

The present configuration of modulation system 100 provides another advantage. As is well known in the art, switching of any capacitor can generate error charge due to kT/C noise generation at the switches. Any error charge which collects at the accumulation capacitor will reduce the accuracy of the analog to digital conversion. In the present configuration, because the output signal is taken from a point within the feedback loop of the amplifier, the kT/C noise generated as a result of switching capacitor Caccum by switch S3 is reduced. The noise reduction is due to the fact that any switch-S3-sampled-kT/C-noise is split between the amplifier output and capacitor Caccum. The closed loop amplifier topology present during this switching time insures that the majority of the sampled kT/C noise flows to the amplifier output, where it is dissipated. This is especially effective for reducing the accumulated error due to the kT/C noise event when switch S3 is opened.

In accordance with the present invention, modulation system 100 implements data dependant charge accumulation by generating reference charge packets having an opposite polarity to that of the input charge packet in a data dependent manner and combining the reference charge packet with the input charge packet in the same clock cycle so that only the sum of the input charge packet and the reference charge packet, when applied, is provided to the integrator for accumulation. The data dependent signals are generated by a logic circuit 123. Referring to FIG. 1, the inverse of the digital_out signal, on a terminal 122, is coupled to logic circuit 123 for generating the data dependent Data_dep signal (on node 130) and its inverse Data_dep_bar signal (on node 132). Data_dep signal is coupled to switch 452 and Data_dep_bar signal is coupled to switch 454 of charge packet generator circuit 408 (FIG. 2). In this manner, charge packet generator circuit 408 either generates a voltage pulse or remains inactive based on the data dependent signal and its inverse. As a result, the reference charge packets are generated in a data dependent manner to be accumulated by integrated 101.

Logic circuit 123 is controlled by a clock signal Clk1 and is activated on the falling edge of clock Clk1 for generating the Data_dep and Data_dep_bar signals. In the present embodiment, logic circuit 123 includes an NOR logic gate 124 receiving the inverse of the digital out signal (on terminal 122) and clock Clk1. The output of NOR gate 124 is the Data_dep signal. An inverter 128 is used to generate the inverse signal Data_dep_bar. Note that FIG. 1 merely illustrates one embodiment of logic circuit 123 and one of ordinary skill in the art would appreciate that logic circuit 123 can be implemented in other manners using other combinations of logic gates to generate the same data dependent signals.

In operation, during the charge balancing phase of each sampling cycle which is controlled by clock Clk1, an input charge packet is generated and combined with a reference charge packet, generated in a data dependent manner, and the sum of the input charge packet and the reference charge packet, if applied, is provided to the integrator for accumulation. When the charge accumulated in capacitor Caccum is negative, the voltage integ_out at the output node 114 of integrator 101 becomes a positive voltage, the voltage integ_out_buf is also positive and comparator 120 generates a logical high value ("1") as digital_out. The inverse of digital_out on line 122 is thus a logical low value. Accordingly, data_dep signal on node 130 is asserted and while data_dep_bar signal on node 132 is deasserted. As a result, a reference charge packet is generated synchronously with clock Clk1 falling edge. Alternately, when the charge accumulated on capacitor Caccum is positive, the voltage integ_out at the output node 114 of integrator 101 is negative, the voltage integ_out_buf is thus negative, and comparator 120 generates a logical low value ("0") as digital_out. The inverse of digital_out on line 122 is thus a logical high value. Accordingly, data_dep_bar signal on node 132 is asserted while data_dep signal on node 130 is deasserted. As a result, no reference charge packet is generated and only the input charge packet is accumulated at capacitor Caccum. In this manner, modulation system 100 accumulates the charge associated with the reference charge packet in a data dependent manner.

As mentioned above, modulation system 100 of the present invention employs correlated double sampling (CDS) to cancel the amplifier DC offset voltage, 1/f noise and wideband amplifier noise. Specifically, during the CDS phase activated by clock signal Clk3, integrator 101 is shorted out and capacitor Caccum is disconnected from the amplifier. Any offset voltage, input 1/f noise and wideband voltage noise, collectively referred to as "the amplifier error voltage", at the input terminals of amplifier 112 also appears at the output terminal (node 116) of amplifier 112. Due to the short-circuited connection at amplifier 112, the voltage at the right plate of capacitor Cin is thus charged to the amplifier error voltage. In this manner, the amplifier error voltage is stored on capacitor Cin and is cancelled out at amplifier 112 during the subsequent input acquisition phase. Thus, a highly precise output voltage can be generated at amplifier 112, free of offset errors and amplifier noise.

In the present embodiment, CDS is implemented without the use of switched capacitors at the analog input terminal of the modulation system. In the conventional systems, switched capacitors are typically used at the modulator analog input terminal and introduce several disadvantages. For example, the use of switched capacitors always causes wideband kT/C noise to be sampled at the input to the modulation system. Furthermore, the use of switched capacitors at the analog input terminal can cause current spikes to be pulled from the analog input source which current spikes can cause accuracy problems. Specifically, the current spikes can result in ringing on the sampled waveform and thereby introduce uncertainties into the sampled input signal. By avoiding the use of switched input capacitors, the modulation system of the present invention avoids the above deficiencies.

The modulation system of the present invention combines the functionality of the sensor excitation, signal conditioning, and AC coupling within the circuitry required for a charge balancing modulation system. When the modulation system of the present invention is incorporated in an analog-to-digital converter, the configuration of the modulation system results in an ADC that requires significantly fewer circuit components. As is well understood in the art, any noise added to the sensor output signal from the sensor excitation source, signal conditioning circuitry, AC coupling or ADC circuits will degrade the accuracy of digitized measurements. The modulation system of the present invention is implemented in a manner which eliminates many of the typical noise generating circuit elements and reduces the noise generated within the remaining ADC circuitry. As a result, a very low noise modulation system or a low noise ADC can be implemented.

As mentioned above, the modulation system of the present invention can be incorporated in a delta-sigma ADC or an incremental ADC. A complete delta-sigma ADC includes a charge balancing modulator and digital post processing circuitry. The digital post processing circuitry implements digital filtering of the continuous modulator output data stream. An incremental ADC can be made from the same charge balancing modulator with the addition of a means to initialize the modulator and remove the accumulated history of past analog input signals before the start of each new conversion. For a first order converter, the initialization function is implemented by a single reset switch or for higher order incremental systems by reset switches at each integrator, activated before the start of a conversion sequence. The reset switch(es) short out and thus remove the charge accumulated in the integrator(s) within the modulator during tie past conversions. The digital post processing circuitry within an incremental ADC also contains a means to initialize the circuit and remove all past history before the start of each conversion. In an incremental ADC, the digital post processing circuitry used to process the digital data steam to a single multiple bit output value is often implemented using one or more settable counters whose count is set to a known value before each conversion. For a detailed description of incremental ADCs and delta-sigma ADCs, refer to J. Robert, G. Temes, V. Valencic, R. Dessoulavy and P. Deval, "A 16-bit Low-Voltage CMOS A/D Converter", IEEE Journal of Solid-State Circuits, Vol. SC-22, No. 2, April, 1987, pp. 157–163.

Referring to FIG. 1, modulation system 100 as shown implements the front end of a first order delta-sigma ADC for digitizing analog signals from input sensor 102. The addition of a single switch across capacitor Caccum, activated only before the start of each conversion, implements the front end of a first order incremental sensor digitizing ADC.

System Operation

Figure 3:
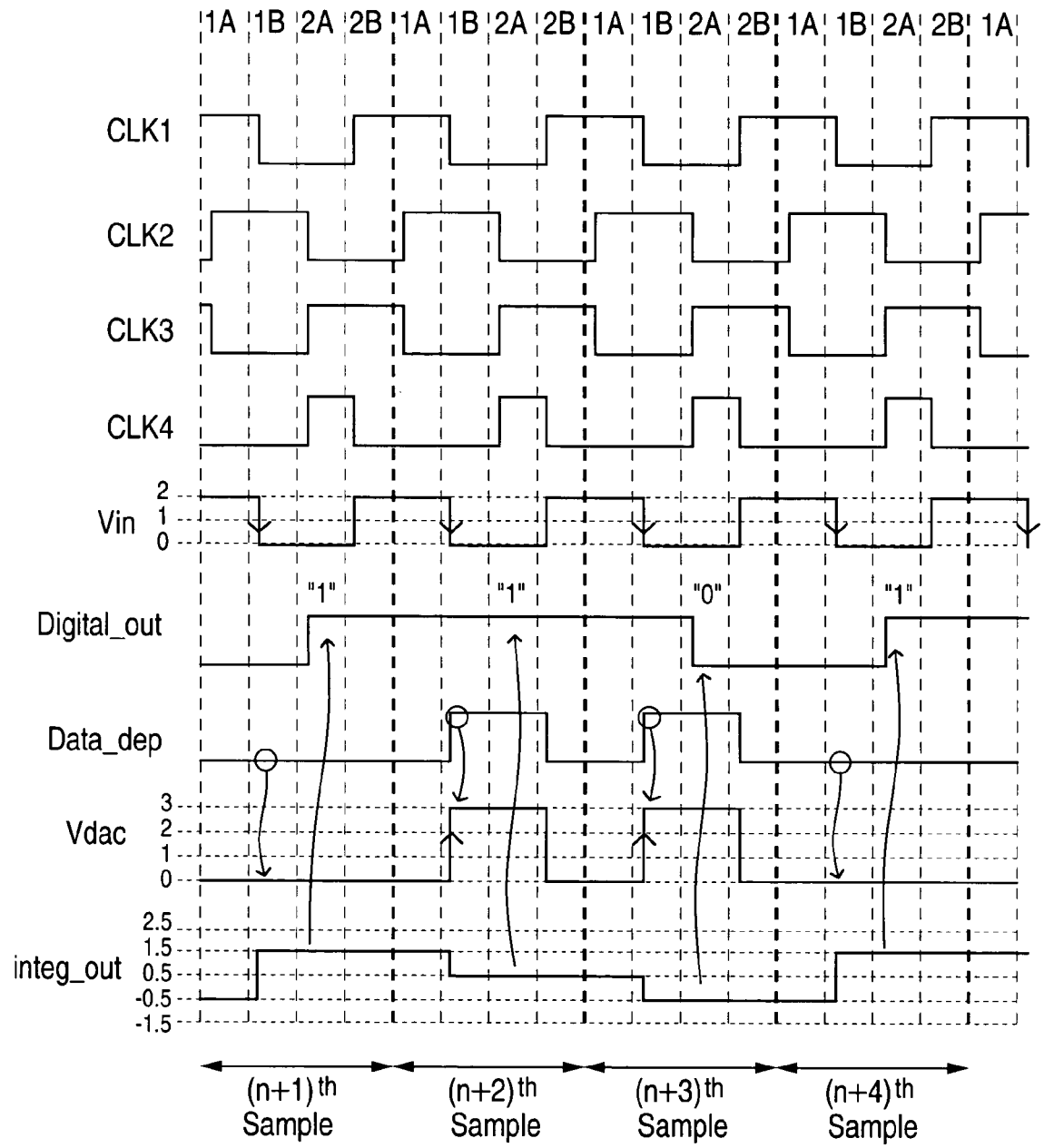
FIG. 3 illustrates one representative clocking scheme under which the modulation system of the present invention can be operated.

Having described the overall structure of the modulation system of the present invention, the operation of the modulation system will now be described with reference to the timing diagram of FIG. 3. FIG. 3 illustrates one representative clocking scheme under which the modulation system of the present invention can be operated. Of course, one of ordinary skill in the art would appreciate that other clocking schemes can also be used to operate the modulation system of the present invention to achieve the desired low noise, high precision analog-to-digital conversion. In the present illustration, modulation system 100 is operated using a four-phase clocking scheme which is 1.5 times faster than when a six-phase clocking scheme is used.

Referring to FIG. 3, the clock signal waveforms and the corresponding values for the digital_out signal, the Data_dep signal and the integ_out signal are shown for four representative samples during a conversion of the input voltage step Vin. For the case where a first order incremental ADC is implemented, a single conversion to obtain q-bit digital output data requires $2^q$ samples of the input voltage step. For instance, to convert an analog value into a 16-bit digital output data will require 65,536 samples in a single conversion. In the present embodiment, it is assumed that the amplitude of the input voltage step does not change or changes very slowly during the time of a single conversion so that dynamic measurement errors can be ignored. In one embodiment of the present invention, a conversion time of 100 ms is required to obtain digital data of 16 bit precision and a conversion time of 6.25 ms is required to obtain digital data of 12 bit precision. Therefore, as long as the sensed input condition is not changing rapidly with respect to the conversion time period, the above assumption will hold.

FIG. 3 illustrates the timing and signal waveforms for the $(n+1)^{th}$ to $(n+_4)^{th}$ samples of a conversion using modulation system 100 of the present invention. The initialization of modulation system 100 and the initial conditions of the various nodes of the system are not shown in FIG. 3. In one embodiment, when modulation system 100 is used to implement an incremental ADC, a switch is coupled across capacitor Caccum to short out capacitor Caccum before each conversion to remove any charge stored thereon. However, the shorting of capacitor Caccum in an incremental ADC implementation between conversions is optional as any residual charge on the capacitor will only result in small measurement errors. In a delta sigma ADC application the capacitor Caccum is never shorted out between conversions, as it is required to hold a residue charge from past conversion cycles.

Each sampling cycle of modulation system 100 can be viewed as consisting of three stages: a charge integration and charge balancing phase, a data readout phase and a CDS phase. Referring to FIG. 3, timing intervals 1A, 1B, 2A, and 2B are provided to denote the different stages of the sampling cycle. Furthermore, signal integ_out as illustrated in FIG. 3 is a voltage signal used to indicate the amount of charge stored on capacitor Caccum. Capacitor Caccum is located within the negative feedback path of inverting amplifier 112. Because the inverting amplifier will force the left plate of capacitor Caccum at the inverting input terminal (node 110) to virtual ground, the integ_out voltage signal at the right plate of capacitor Caccum (or the integrator output node 114) is given as:

$$V_{integ\_out} = -\frac{Q_{accum}}{C_{accum}}.$$

In FIG. 3, the vertical scale of the integ_out signal is divided into slices demarcating separate voltage units which voltage unit is a measurement unit used in the present description to quantify the charge stored or the charge transferred in modulation system 100. The voltage units are defined solely to show the voltage change due to integration of one unit charge, where said unit charge will be used in the description of the operation of modulation system 100. The vertical scale associated with the integ_out signal does not define an absolute zero voltage reference point. However, to facilitate the description of the operation of the modulation system of the present invention, an artificial zero volt reference value for the integ_out signal can be assumed to correspond to a voltage unit level between the second voltage unit and the third voltage unit. Similarly, voltage steps Vin and Vdac are expressed in FIG. 3 in terms of voltage units. Voltage steps Vin and Vdac in FIG. 3 are not drawn to scale.

At the $n^{th}$ sampling cycle, modulation system 100 has generated a digital_out value of "0". At the end of the $n^{th}$ sampling cycle, capacitor Caccum has stored thereon 0.5 units of charge as a result of the charge integration and charge balancing phases during the $n^{th}$ sampling cycle. The voltage of the integ_out signal at output node 114 of integrator 101 is therefore at negative 0.5 (−0.5) voltage units. The digital_out signal of comparator 120 is thus at a logical low value ("0") as a result of integ_out being at −0.5 voltage units.

At the end of the nth sampling cycle, clock Clk1 and clock Clk3 are at a logical high value (asserted) while clock Clk2 and clock Clk4 are at a logical low value (deasserted). As a result of clock Clk1 being asserted, switch S1 is closed and the input sensor is excited by the application of the switched current I1 from current source 105. The input voltage Vin is thus stable at a high voltage level. Switch S2 is closed as a result of clock Clk3 being asserted and switch S3 is open as a result of clock Clk2 being deasserted. Integrator 101 of modulation system 100 is inactive and placed a CDS phase (to be explained in more detail below).

At the beginning of the $(n+1)^{th}$ sampling cycle (interval 1A), clock Clk2 and clock Clk3 switch state so that switch S2, controlled by clock Clk3, is now open and switch S3, controlled by clock Clk2, is now closed. Integrator 101 is therefore in an active mode and the charge integration and charge balancing phase has begun. Then, at interval 1B, clock Clk1 is deasserted (goes low). Since clock Clk1 controls the switched excitation current circuit for input sensor 102 and also logic circuit 123 for generating the data dependent signals, two events take place at the falling edge of clock Clk1: the generation of the input charge packet and the generation of the reference charge packet in a data dependent manner.

First, at the switched excitation current circuit, switch S1 is open in response to the falling edge of clock Clk1 and input sensor 102 is excited by the removal of the switched current I1. In response to the switched current excitation, input voltage Vin steps from a first voltage value to a second, lower voltage value. The change in voltage Vin (ΔVin) is AC coupled through capacitor Cin to the inverting input terminal of amplifier 112. Because it is assumed that the input voltage step persists for a long time as compared to the input circuit time constants, all the charge collected at the left plate of capacitor Cin associated with ΔVin is transferred to the right plate of capacitor Cin. Specifically, the charge coupled through capacitor Cin is given by:

$$Q_{in} = C_{in} \Delta V_{in},$$

where ΔVin is the change in input voltage Vin due to the synchronous switched current excitation and Cin is the value of capacitor Cin. In this manner, an input charge packet Qin, indicative of the change in voltage step Vin, is generated and coupled to integrator 101 during interval 1B.

Second, logic circuit 123 is activated by the deassertion of clock Clk1 and logic circuit 123 generates the data dependent signals to control charge packet generator circuit 108 to either generate or prohibit from generating a reference charge packet. When one input signal of NOR gate 124 is at a logical low value, the NOR gate becomes an inverter for the other input signal. Thus, in response to clock Clk1 being deasserted, logic circuit 123 operates to invert the inverse of the digital_out signal coupled to NOR gate 124 on terminal 122. In the current time interval, digital_out has a logical low value. Thus, NOR gate 124 generates a logical "low" value on output node 130 as the Data_dep signal. A logical "hi" value on output node 132 is also generated as the Data_dep_bar signal. With the Data_dep signal being low and the Data_dep_bar signal being high, charge packet generator circuit 108 is not activated and thus no reference charge packet is generated during this time interval. In FIG. 3, voltage Vdac remains at 0 voltage at time interval 1B.

During time interval 1B, modulation system 100 performs both charge integration and charge balancing. That is, the input charge packet is generated by the switched current excitation and the reference charge packet is generated in a data dependent manner. The input charge packet and the reference charge packet having reverse polarities are to be combined at the input node (node 110) of integrator 110 and the sum in charge (a "sum charge packet") is accumulated by integrator 101. During interval 1B of the $(n+1)^{th}$ sampling cycle, an input charge packet is generated in response to the switched excitation of input sensor 102 but no reference charge packet is generated because the digital_out signal of modulation system 100 is at a logical low value ("0"). Thus, in the current sampling cycle, the input charge packet alone is provided to integrator 101 for accumulation but it is understood that in other sampling cycles, as will be described below, the sum charge packet, representing the sum of the input charge packet and the applied reference charge packet of opposite polarities, is provided to integrator 101 for accumulation.

Because integrator 101 is in the active mode, amplifier 112 forces the inverting input terminal (node 110) to a virtual ground Therefore, the charge coupled through capacitor Cin, which may be combined with a reference charge packet coupled to node 110, is directed to capacitor Caccum. Because amplifier 112 is configured in an inverting mode, the increase in charge stored in capacitor Caccum causes a decrease in the voltage at integ_out proportional to the magnitude of the charge to be accumulated. The magnitude of the charge to be accumulated is the sum between the input charge packet and the reference charge packet, having opposite polarities, and the voltage change at the integ_out node is given as:

$$V_{\text{integ\_out}} = -\frac{\Delta Q_{accum}}{C_{accum}} = -\frac{(Q_{in} + Q_{dac})}{C_{accum}} = -\frac{(-\Delta V_{in} C_{in} + \Delta V_{dac} C_{dac})}{C_{accum}},$$

where Qaccum is the charge accumulated at capacitor Caccum, and Caccum represents the capacitance of capacitor Caccum. For the current sampling cycle where only the input charge packet is present, the voltage change at the integ_out node is given as:

$$V_{\text{integ\_out}} = -\frac{\Delta Q_{accum}}{C_{accum}} = -\frac{Q_{in}}{C_{accum}} = -\Delta V_{in}\frac{C_{in}}{C_{accum}}.$$

In the present embodiment, capacitor Cin and capacitor Caccum have the same capacitance value. In one embodiment, the capacitance of capacitor Cin and of capacitor Caccum are both two picofarads. In the present illustration, it is assumed that the falling edge of Vin causes two charge units to be removed from capacitor Caccum and thus the integ_out signal increases by two voltage units from −0.5 voltage units to a level of +1.5 voltage units.

Because integrator 101 is active during the entire interval 1B, that is, the integrator is active before, during and after the Vin rising edge, continuous time integration of the input voltage step signal is realized. As described above, the use of continuous time integration to sample the input analog voltage has the effect of low pass filtering the input signal and thereby filters out any wideband noise that may present on the input signal.

After sampling and integrating the charge associated with the falling edge of input voltage step Vin and the reference charge packet, if any, the charge integration and charge balancing phase of the sampling cycle is complete. Modulation system 100 then begins the data readout phase. At time interval 2A, clock Clk4, driving comparator 120, is asserted. Comparator 120 is thus interrogated and the digital_out value for the current sample is read out. Because integ_out has a value of +1.5 voltage units, the integ_out_buf signal has a relatively positive voltage level (such as +K*1.5 voltage units). In the present illustration, K is assumed to be 1 and integ_out_buf signal is also +1.5 voltage units. At comparator 120, the integ_out_buf signal is compared with reference voltage $V_{Ref1}$ which is assumed to be at zero volt in the present embodiment. Because the integ_out_buf signal is greater than $V_{Ref1}$, comparator 120 generates a logical high value ("1") as the digital_out "Q" output. Thus, the digital_out signal switches to a logical "1" value during interval 2A in response to clock Clk4. Clock Clk4 is deasserted during interval 2B. However, the digital_out value remains until the next rising edge of clock Clk4 triggering another interrogation of the integ_out_buf signal.

During interval 2A, clocks Clk2 and Clk3 also switch states so that switch S2, controlled by clock Clk3, is now closed and switch S3, controlled by clock Clk2, is now open. Integrator 101 is made inactive and modulation system 100 thereby performs correlated double sampling (CDS) for the next sampling cycle. In the present timing scheme, precharging the input capacitor with the amplifier error voltage from amplifier 112 is always performed in one sampling cycle for the next sampling cycle. As a result of closing switch S2, amplifier 112 is shorted out and integrator 101 is inactive. Therefore, any amplifier error voltage, such as those due to DC offset voltage and 1/f noise, appears on the amplifier output terminal. Input capacitor Cin is thereby precharged with the amplifier error voltage so that, at the next sampling cycle, the amplifier error voltage is cancelled out during the sampling and charge integration phase. In this manner, correlated double sampling of the modulation system is effectuated.

In the present embodiment, when clock Clk3 is asserted, integrator 101 is forced to be inactive. Therefore, clock Clk3 can be used advantageously to block the sampling of undesired signal transitions. For instance, to set up input voltage step Vin for the next sampling cycle, clock CLK1 needs to be asserted to close switch S1 and return input voltage Vin to a stable high value. The low-to-high transition of input voltage Vin should not be accumulated by integrator 101 as the low-to-high transition will cancel out the charge previously accumulated at the high-to-low transition. Therefore, in the present timing scheme, clock Clk1 is asserted during the active cycle of clock Clk3 (interval 2B) where the integrator is deactivated. Thus, the rising edge of input voltage step Vin is ignored by modulation system 100 and no charge from the Vin rising edge is accumulated.

At the end of each sampling cycle, capacitor Caccum has accumulated charge based on the change in input voltage ΔVin and based on the reference charge packet, applied in a data dependent manner. During the (n+1)$^{th}$ sampling cycle the accumulated charge has decreased by two units, resulting in a held charge of −1.5 charge units at capacitor Caccum and a voltage at integ_out of +1.5 voltage units. The modulation system then proceeds to the next sampling cycle.

During the (n+2)$^{th}$ sampling cycle, modulation system 100 operates in the same manner as described above. First, integrator 101 is put in an active mode (interval 1A) and then input sensor 102 is excited by the removal of the switched excitation current. During interval 1B, an input charge packet having negative magnitude corresponding to the step change in input voltage Vin is generated.

At the same time, modulation system 100 looks at the digital_out value to determine if a reference charge packet needs to be generated. In the present embodiment, a reference charge packet is generated whenever the digital_out signal is at a logical "1" value. In the current sampling cycle, the digital_out signal Q is at a logical high value and therefore logic circuit 123 sees a logical low value on terminal 122 which is the inverse of the digital_out signal ($\overline{Q}$). Logic circuit 123 asserts the Data_dep signal on node 130 (FIG. 1) in response to the digital_out signal being at logical "1". The Data_dep signal transitions to a logical high value while the Data_dep_bar signal transitions to a logical low value. By asserting the Data_dep signal, reference charge packet generator 108 is activated and a reference charge packet is generated. In FIG. 3, a voltage waveform Vdac represents the voltage used to generate the reference charge packet. For example, voltage Vdac can be the voltage Vdac in the charge packet generator circuit of FIG. 2. The reference charge packet has a voltage polarity opposite to that of the input charge packet. Thus, in the present illustration, the reference charge packet is being generated by a positive-going voltage step of voltage Vdac and has a magnitude of three voltage units.

In response to clock Clk1 making a high-to-low transition during time interval 1B of the (n+2)$^{th}$ sampling cycle, an input charge packet having −2 charge units and a reference charge packet having +3 charge units are generated and combined simultaneously at input node 110 of amplifier 112. A sum charge packet of +1 charge unit is thus created and accumulated by integrator 101 onto capacitor Caccum. When the charge associated with the sum charge packet having one positive charge unit is accumulated, the charge at capacitor Caccum increases by one charge unit from a −1.5 charge units to −0.5 charge units. The voltage at integ_out (node 114) decreases by one voltage unit from 1.5 voltage units to 0.5 voltage units.

During interval 2A, comparator 120 continues to read an integ_out_buf value (0.5 voltage units) that is greater than V$_{Refl}$, digital_out remains at a logical "1" value. At the end of the (n+2)$^{th}$ sampling cycle, a sum of −0.5 charge units is stored on capacitor Caccum, and the voltage at integ_out is at +0.5 voltage units.

To implement charge balancing in modulation system 100, a positive reference charge packet is applied to integrator 101 at each sampling cycle to be combined with the negative charge accumulated from the ΔVin voltage. In the present embodiment, to effectuate charge balancing, only the positive charge packet associated with the rising edge of voltage Vdac is used for the reference charge packet. Thus, in accordance with the present timing scheme, the negative-going transition of voltage Vdac is applied during the active cycle of clock Clk3 while integrator 101 is deactivated so that the negative charge packet associated with the falling edge of voltage Vdac is ignored. In modulation system 100, the same clock signal clock Clk1 controls the switched excitation current circuit for generating an input charge packet on node 110 and charge packet generator circuit 108 for generating a reference charge packet on node 110. Thus, voltage Vdac is synchronous with voltage Vin. Referring to FIG. 3, clock Clk1 is asserted during the active cycle of clock Clk3 (interval 2B) such that the falling edge of voltage Vdac (the unwanted negative charge packet) occurs during the integrator inactive period.

As a result of asserting clock Clk1 during the active period of clock Clk3 (interval 2B), the accumulated charge on capacitor Caccum due to the falling edge of input voltage Vin and the rising edge of voltage Vdac is preserved while the charge associated with the rising edge of input voltage Vin and the falling edge of voltage Vdac is ignored. The modulation system is now ready to begin the next sampling cycle.

At the (n+3)$^{th}$ sampling cycle, an input charge packet is generated at time interval 1B in response to the falling edge of clock Clk1. A reference charge packet is also generated as a result of digital_out signal being at a logical "1" value. Thus, a sum charge packet of +1 charge unit is formed at node 110 and accumulated by integrator 101 onto capacitor Caccum. When the charge associated with the sum charge packet having one positive charge unit is accumulated, the charge at capacitor Caccum increases by one charge unit from −0.5 charge units to 0.5 charge units. The voltage at integ_out (node 114) decreases by one voltage unit from 0.5 voltage units to −0.5 voltage units.

During interval 2A, comparator 120 reads an integ_out_buf value (−0.5 voltage units) that is less than V$_{Refl}$, digital_out transitions to a logical "0" value in response to clock Clk4. At the end of the (n+$_3$)$^{th}$ sampling cycle, a sum of 0.5 charge units is stored on capacitor Caccum, and the voltage at integ_out is at −0.5 voltage units.

At the (n+4)$^{th}$ sampling cycle, an input charge packet is generated at time interval 1B in response to the falling edge of clock Clk1. A reference charge packet is not generated as a result of digital_out signal being at a logical "0" value. Thus, the input charge packet having negative two charge units is accumulated by integrator 101 onto capacitor Caccum. When the charge associated with the input charge packet having two negative charge units is accumulated, the charge at capacitor Caccum decreases by two charge units from 0.5 charge units to −1.5 charge units. The voltage at integ_out (node 114) increases by two voltage units from −0.5 voltage units to +1.5 voltage units.

During interval 2A, comparator 120 reads an integ_out_buf value (+1.5 voltage units) that is greater than V$_{Refl}$, digital_out transitions to a logical "1" value in response to clock Clk4. At the end of the (n+4)$^{th}$ sampling cycle, a sum of −1.5 charge units is stored on capacitor Caccum, and the voltage at integ_out is at +1.5 voltage units.

As shown by the operation of sampling cycles n+1 to n+4, modulation system 100 implements data dependent charge balancing where the reference charge packet is generated in a data dependent manner depending on the value of the digital_out signal. The reference charge packet, when provided, is combined with the input charge packet so that the sum of the input charge packet and the reference charge packet is accumulated by the integrator of the modulation system.

In the present embodiment, modulation system 100 implements charge balancing by sampling the falling edge of the input voltage step Vin and generating, in a data dependent manner, reference charge packets using the rising edge of voltage Vdac. Because integrator 101 is an inverting integrator, the integ_out signal increases due to a negative sum charge packet and decreases due to a positive sum charge packet.

As a result of adding and subtracting the charge due to the ΔVin voltage and the charge from the reference charge packet, the modulation system generates a digital_out signal in the form of a ones density data stream. The single bit output data stream generated by comparator 120 will exhibit a ones density proportional to the amplitude of the change in input voltage ΔVin as compared to the reference charge packet. Specifically, under the assumption that the step size ΔVin does not change appreciably over a single conversion, the average ones density is given as:

$$OnesDensity = \Delta V_{in} \frac{C_{in}}{C_{ref} V_{ref}} = \frac{Q_{in}}{C_{ref}},$$

where Qref denotes the amount of charge in the reference charge packet. The ones density value is always less than or equal to 1 as Qin is always less than or equal to Qref. For example, in the present illustration, the ΔVin voltage step generates an input charge Qin that has a charge unit level that is ⅔ of the reference charge packet Qref. Thus, a ones density data stream containing 66.7% ones and 33.3% zeroes is generated. After completing a conversion of the input voltage value, the ones density pulse stream can be processed by the subsequent digital processing circuitry to determine the digital value thereof.

ADVANTAGES

The advantages of the modulation system of the present invention are numerous. In particular, the modulation system of the present invention realizes improvements and performance enhancements over prior charge balancing modulation systems, such as that described in U.S. Pat. No. 6,750,796.

First, the headroom margin of the integrated output signal is improved. The headroom improvement is achieved to allow circuit operation at even lower Vdd voltages. In the prior modulation systems, the integ_out signal from the integrator of the modulation system has a large voltage swing, such as up to four voltage units. But the modulation system of the present invention, because the input voltage step Vin and the reference voltage step Vdac of opposite polarity are sampled at the same time, the integ_out signal can have a smaller voltage swing, such as only two voltage units. Thus, the headroom margin of the modulation system is improved and the system can operate with Vdd voltages that are lower than those possible with prior systems.

Second, the modulation system operates based on a four-phase timing scheme so that the latency between the reference signal to the input signal is reduced. The modulation system of the present invention can achieve a faster conversion rate as compared to prior modulation systems requiring six or more phase timing schemes.

Third, autozero accuracy of the modulation system is improved because the integ_out voltage swing is decreased. The charge splitting accuracy during autozero is dependent on the ratio of the capacitance of capacitor Caccum and the input capacitance of buffer 118. The input capacitance of buffer 118 is a function of the integ_out voltage. By reducing the voltage swing on the integ_out voltage, the variation of the input capacitance of buffer is decreased. Thus, autozero can be more accurate.

Lastly, the latency between reference sampling and input sampling is decreased. In prior systems, the decision to sample the reference charge packet is dependent on the data value of the last sample cycle and thus the data output has a one cycle latency. As a result, integ_out signal can change but the digital_out value will be held for another cycle. In accordance with the present invention, the input charge packet and the reference charge packet are applied at the same time. Therefore, there is no more latency between input and reference sampling. When the integ_out signal changes, the digital_out signal will change in response.

ALTERNATE EMBODIMENTS

In the above descriptions, amplifier 112 is implemented as an operational amplifier where the non-inverting input terminal is connected to the ground potential. In an alternate embodiment, the amplifier can be implemented as a single input self-referential inverting transconductance amplifier (referred to herein as a gmIC). An amplifier capable of operating at very low voltage levels with uncompromised or even improved performances in transconductance is described in commonly assigned U.S. Pat. No. 6,147,550, entitled "Method And Apparatus For Reliably Determining Subthreshold Current Densities In Transconductance Cells," of Peter R. Holloway, issued Nov. 14, 2000; and also in commonly assigned U.S. Pat. No. 5,936,433, entitled "Comparator Including A Transconducting Inverter Biased To Operate In Subthreshold," of Peter R. Holloway, issued Aug. 10, 1999. Both of the aforementioned patents are incorporated herein by reference in their entireties. Thus, in the alternate embodiment, amplifier 112 is implemented based on the transconductance inverting cell technology described in the aforementioned patents and amplifier 112 is self-referencing. Therefore, amplifier 112 includes only one input terminal coupled to node 110 and no reference voltage input terminal is needed.

Furthermore, in an alternate embodiment, buffer 118 and comparator 120 can each be implemented as a transconductance amplifier (gmIC) described above. Because a gmIC is a single input self-referential amplifier, comparator 120 will not require a separate reference voltage.

Switches S2 and S3 in modulation system 100 are composed of MOS transistors and are typically controlled by non-overlapping digital signals. When any MOS switch is turned from on to off, its stored channel charge will be shared by the capacitors and circuit elements connected to both its analog input and its analog output terminals. This charge sharing condition is often referred to as charge feed-through. This channel charge is an additive error because it does not originate from the input analog signals but is generated from within the switches when they are switched off.

The switches in modulation system 100 can be implemented using any conventional switch circuits. According to another aspect of the present invention, switches S2 and S3 of modulation system 100 are implemented as "boosted" switches to reduce charge feed-through that may occur when the switches are being turned off. A self-bootstrapping constant on resistance "boosted" switch circuit is described in copending and commonly assigned U.S. patent application Ser. No. 10/402,080, now U.S. Pat. No. 6,956,411, entitled "A Constant RON Switch Circuit with Low Distortion and Reduction of Pedestal Errors," of Peter R. Holloway, filed Mar. 27, 2003, which patent application is incorporated herein by reference in its entirety. When the low distortion switch circuit described in the aforementioned patent application is used to implement switches S2 and S3, errors resulting from channel charge feed-through during the switching of the switches are significantly reduced.

Furthermore, according to another aspect of the present invention, switch S2 and switch S3 are scaled to ensure that the net charge error accumulated in capacitor Caccum during each sampling cycle is nearly zero. Specifically, because switch S2 and switch S3 are connected to different nodes within the modulator circuit, the feed-through charge error generated by equally-sized switches does not result in a zero net charge error across capacitor Caccum. It is known that the channel charge error generated within a switch is proportional to its gate area. By scaling the ratio of the gate areas of switches S2 and S3 appropriately, the amount of charge error can be applied to both sides of capacitor Caccum, first by one switch and then by the other, which results in a net charge error of nearly zero being held in capacitor Caccum at the end of each sampling cycle.

As mentioned above, the timing scheme shown in FIG. 3 for operating modulation system 100 is illustrative orgy. One of ordinary skill in the art would appreciate that modifications to the clocking schemes and the clock duration can be made to operate the modulation system of the present invention in the charge integration and charge balancing phase, the data readout phase, and the CDS phase. The length of time assigned to each interval can be varied to accommodate the settling time required in each operational interval. Furthermore, in the timing scheme shown in FIG. 3, modulation system 100 operates to sample the falling edge of the input voltage step Vin and the rising edge of voltage Vdac generating a positive reference charge packet. However, in other embodiments, modulation system 100 can be operated to sampling the rising edge of the input voltage step Vin and the falling edge of the voltage Vdac generating a negative reference charge packet.

In the above description, a modulation system incorporating a synchronous excitation source and a modulator is used to sample and digitize analog input signals generated by a sensor. According to another aspect of the present invention, the modulator of the modulation system of the present invention can be operated as a stand alone modulator receiving analog input signals from an excitation source driving a sensor where the excitation source is not integrated with the modulator to operate as a single synchronous unit. In that case, the excitation source can be synchronized with the modulator using known synchronization schemes. For example, clocks driving the excitation source can be synchronized with clocks driving the modulator using a phase lock loop. Thus, the embodiment of modulation system 100 shown in FIG. 1 is illustrative only and is not intended to limit the use of the modulation system as an integrated unit including an excitation source and a modulator. The modulator of the modulation system can be adapted to operate with an external excitation source as long as synchronous detection is implemented.

The modulation system of the present invention can be applied to sample and digitize the analog signal generated at an impedance varying sensor. For instance, the modulation system can be used to make temperature, resistance, pressure or displacement measurements by providing the appropriate input sensor elements.

Figure 4:
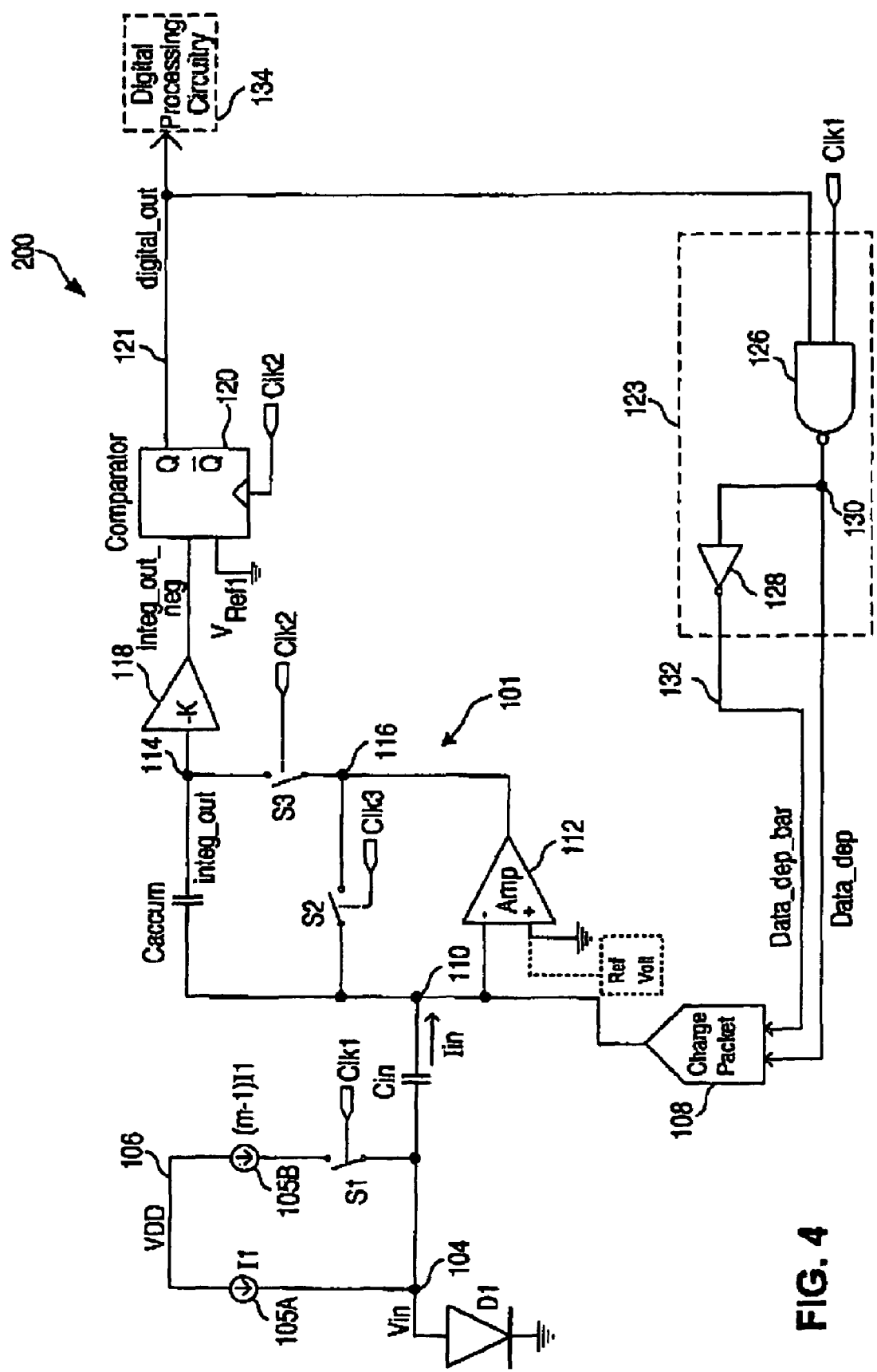
FIG. 4 illustrates an alternate embodiment of the modulation system of the present invention adapted for temperature measurement.

FIG. 4 illustrates an alternate embodiment of the present invention where the modulation system is adapted for temperature measurement. Referring to FIG. 4, for the purpose of temperature sensing, the input sensor element is typically implemented as a diode or diode-connected bipolar transistor, illustrated as diode D1. As is well known in the art, to measure temperature of the substrate on which diode D1 is built, two currents with a known ratio are applied to the temperature sensing diode and the voltages generated by the diode at the two different current levels are measured to compute a $\Delta V_{BE}$ voltage which is proportional to temperature.

In the configuration in FIG. 4, diode D1 is excited by the switched current circuit including two currents having a known ratio. Switch S1 is used to switchably connect current source 105B having current (m−1)*I1 to diode D1 while current source 105A providing a current I1 remains connected to diode D1. Thus, diode D1 is excited by a current of I1 and a current of m*I1 based on the switching of the switched current circuit, where m can represent any fixed ratio of known and predictable value and does not have to be an integer.

When the reference charge packet is appropriately compensated against changing external conditions, such as temperature or supply voltage variations, and the input voltage step $\Delta$Vbe is assumed not to change appreciably over the measurement time, modulation system 200 implements the following transfer function:

$$OnesDensity = \Delta V_{be} \frac{C_{in}}{C_{ref} V_{ref}}.$$

As $\Delta$Vbe exhibits a known linear increase with temperature, the resulting ones density is proportional to the temperature at the sensing diode D1. Then, digital post processing can be applied to accumulate a sum of the ones over a given conversion time interval, which sum is linearly proportional to the diode temperature.

In other embodiments of the present invention, the modulation system can be adapted to measure resistance. The input sensor can be a resistor whose resistance varies with applied pressure or ambient temperature or other parameters of interest, such as distance. The resistor can be excited by the switched current circuit to generate a voltage change corresponding to the resistance value.

Besides being adapted for temperature measurements, modulation system 200 is also adapted to use a different timing scheme than that used by modulation system 100 of FIG. 1. Specifically, modulation system 200 is configured to excite diode D1 so that the input voltage step Vin at node 104 switches from a first voltage value to a second, higher voltage value. Thus, integrator 101 is coupled to sample the positive input charge packet generated by the rising edge of the input voltage step Vin. The polarity of the reference charge packet is changed accordingly so that a negative reference charge packet is generated, in a data dependent manner, and coupled to integrator 101 to be combined with the positive input charge packet.

Figure 5:
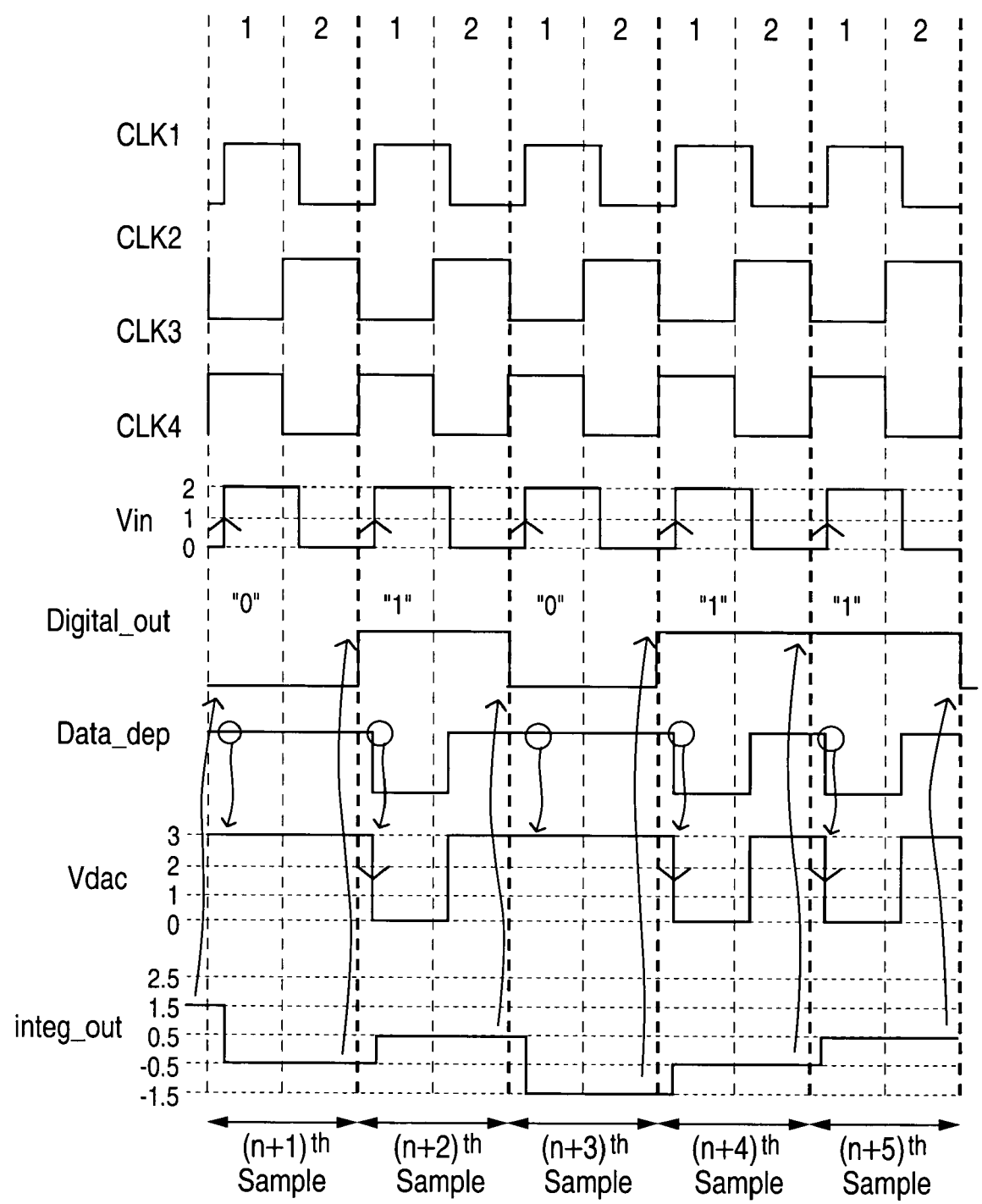
FIG. 5 illustrates an alternative clocking scheme under which the modulation system of FIG. 4 can be operated.

FIG. 5 illustrates an alternative clocking scheme under which modulation system 200 can be operated. The timing scheme of FIG. 5 illustrates modulator operation for sampling a positive input charge packet and a negative reference charge packet. The timing scheme of FIG. 5 also illustrates the use of a two-phase clocking scheme, as compared to the four-phase clocking scheme of FIG. 3. The use of a two-phase clocking scheme can realize a 50% reduction in the conversion time which significantly improves the speed of a conversion cycle. In the timing scheme of FIG. 5, clock Clk1 is asserted during the charge integration and charge balancing phase of the sampling cycle and clocks Clk2 and Clk3 are complementary clock signals.

Modulation system 200 includes modifications made to adapt the system to operate under the two-phase timing scheme of FIG. 5. One of ordinary skill in the art, upon being apprised of the present invention, would appreciate that the clock signals driving the components of the modulation system of the present invention and the configuration of logic circuit 123 can be modified according to the timing schemes being used.

First, in modulation system 200 of FIG. 4, buffer 118 is implemented as an inverting buffer with a gain of −K. Thus, the output terminal of buffer 118 is an integ_out_neg signal having the opposite voltage polarity as the integ_out signal at node 114. Second, comparator 120 is clocked by clock Clk2 and clock Clk4 is eliminated to realize the two-phase clocking scheme. Thus, comparator 120 interrogates the integ_out_neg value on the rising edge of clock Clk2 which is at the beginning of each sampling cycle. Finally, because clock Clk1 is asserted during the charge balancing phase in the timing scheme of FIG. 5 (as opposed to being deasserted in the timing scheme of FIG. 3), logic circuit 123 includes an NAND gate 126 and receives the digital_out signal on terminal 121 and the clock signal Clk1 as input signals.

The operation of modulation system 200 under the timing scheme of FIG. 5 will now be described. In the present illustration, it is assumed that buffer 118 has a gain of −1 and thus buffer 118 serves merely to invert the polarity of the integ_out signal.

At the end of the $n^{th}$ sampling cycle, capacitor Caccum has stored thereon −1.5 units of charge as a result of the charge integration and charge balancing phases during the $n^{th}$ sampling cycle. The voltage of the integ_out signal at output node 114 of integrator 101 is therefore at +1.5 voltage units.

At the end of the $n^{th}$ sampling cycle, clock signals Clk1 and Clk2 are at a logical low value (deasserted) while clock Clk3 is at a logical high value (asserted). As a result of clock Clk1 being deasserted, switch S1 is open and the input sensor is excited by the application of the switched current I1 from current source 105A. The input voltage Vin is thus stable at a low voltage level. Switch S2 is closed as a result of clock Clk3 being asserted and switch S3 is open as a result of clock Clk2 being deasserted. Integrator 101 of modulation system 200 is in an inactive mode.

At the beginning of the (n+1)th sampling cycle (interval 1), clock Clk2 and clock Clk3 switch state so that switch S2, controlled by clock Clk3, is now open and switch S3, controlled by clock Clk2, is now closed. Integrator 101 is therefore in an active mode and the charge integration and charge balancing phase has begun.

When clock Clk2 is asserted, comparator 120 is activated to interrogate the integ_out_neg value. Thus, on the rising edge of clock Clk2 which is the beginning of the sampling cycle, comparator 120 generates a logical low value ("0") for the digital_out signal as a result of integ_out being at +1.5 voltage units and integ_out_neg being at −1.5 voltage units. The digital_out signal is valid for the entirety of the sampling cycle.

Then, during interval 1, clock Clk1 is asserted (goes high). Since clock Clk1 controls the switched excitation current circuit for diode D1 and also logic circuit 123 for generating the data dependent signals, two events take place at the rising edge of clock Clk1: the generation of the input charge packet and the generation of the reference charge packet in a data dependent manner.

At the switched excitation current circuit, switch S1 is closed in response to the rising edge of clock Clk1 and diode D1 is excited by application of switched current I1 from current source 105A and (m−1)I1 from current source 105B for a total current of m*I1. In response to the switched current excitation, input voltage Vin steps from a first voltage value to a second, higher voltage value. The change in voltage Vin (ΔVin) is AC coupled through capacitor Cin to the inverting input terminal of amplifier 112. It is assumed that the input voltage step persists for a long time as compared to the input circuit time constants so that all the charge collected at the left plate of capacitor Cin associated with ΔVin is transferred to the right plate of capacitor Cin. In this manner, an input charge packet Qin, indicative of the change in voltage step Vin, is generated and coupled to integrator 101 during interval 1.

At the same time, logic circuit 123 is activated by the assertion of clock Clk1 and logic circuit 123 generates the data dependent signals to control charge packet generator circuit 108 to either generate or prohibit from generating a reference charge packet. When one input signal of NAND gate 126 is at a logical high value, the NAND gate becomes an inverter for inverting the other input signal. Thus, when clock Clk1 is asserted, logic circuit 123 operates to invert the digital_out signal coupled to NAND gate 126 on terminal 121. In the current time interval, digital_out has a logical low value. Thus, NAND gate 126 generates a logical "high" value on output node 130 as the Data_dep signal. A logical "low" value on output node 132 is also generated as the Data_dep_bar signal. With the Data_dep signal being high and the Data_dep_bar signal being low, charge packet generator circuit 108 is not activated and thus no reference charge packet is generated during this time interval.

Note that in the present embodiment, a negative reference charge packet is to be generated for balancing the positive input charge packet. Thus, when the charge packet generator circuit of FIG. 2 is used, the voltage Vdac used to generate the reference charge packet has a normally high value and transition to a low value to generate the negative reference charge packet. Thus, the Data_dep signal is normally high and transition to a low value while the Data_dep_bar signal is normally low and transition to a high value to generate the reference charge packet. In FIG. 5, when no reference charge packet is to be generated, voltage Vdac remains at a high voltage level (three voltage units) during the sampling cycle.

During time interval 1, modulation system 200 performs both charge integration and charge balancing. That is, the input charge packet is generated by the switched current excitation and the reference charge packet is generated in a data dependent manner. The input charge packet and the reference charge packet having reverse polarities are to be combined at the input node (node 110) of integrator 110 and the sum in charge is accumulated by integrator 101. During interval 1 of the $(n+1)^{th}$ sampling cycle, an input charge packet is generated in response to the switched excitation of diode D1 but no reference charge packet is generated because the digital_out signal of modulation system 200 is at a logical low value ("0"). Thus, in the current sampling cycle, the input charge packet alone is provided to integrator 101 for accumulation but it is understood that in other sampling cycles, as will be described below, the sum charge packet, representing the sum between the input charge packet and the applied reference charge packet having opposite polarities, is provided to integrator 101 for accumulation.

In response to clock Clk1 making a low-to-high transition in the current sampling cycle, an input charge packet having +2 charge units is generated and coupled to the input node 110 of amplifier 112 for integration onto capacitor Caccum. Thus, during the $(n+1)^{th}$ sampling cycle, the accumulated charge has increased by two units, resulting in a held charge of +0.5 charge units at capacitor Caccum and a voltage at integ_out of −0.5 voltage units.

Then, at the beginning of interval 2 of the sampling cycle, clocks Clk2 and Clk3 switch states to put integrator 101 into an inactive mode and correlated double sampling is performed. During interval 2, clock Clk1 is deasserted so that the high-to-low transition of the input voltage step Vin is ignored by the integrator. The sampling cycle is then complete. Modulation system 200 then proceeds to the next sampling cycle.

During the $(n+2)^{th}$ sampling cycle, modulation system 200 operates in the same manner as described above. Clocks Clk2 and Clk3 switch states and integrator 101 is put in an active mode (interval 1). First, comparator 120 interrogates the integ_out_neg signal on the rising edge of clock Clk2. Because integ_out has a −0.5 voltage value, integ_out has a +0.5 voltage value and comparator 120 generates a logical "1" as the digital_out signal on terminal 121. Then, clock Clk1 is asserted to excite diode D1 and an input charge packet is generated in response.

At the same time, modulation system 200 looks at the digital_out value to determine if a reference charge packet needs to be generated. In the present embodiment, a reference charge packet is generated whenever the digital_out signal is at a logical "1" value. In the current sampling cycle, the digital_out signal Q is at a logical high value and therefore logic circuit 123 deasserts the Data_dep signal on node 130. The Data_dep signal transitions to a logical low value while the Data_dep_bar signal transitions to a logical high value. By deasserting the Data_dep signal, reference charge packet generator circuit 108 is activated and a reference charge packet having negative polarity is generated. Referring to FIG. 5, the reference charge packet is being generated by the negative-going voltage step of voltage Vdac and has a magnitude of negative three voltage units.

In response to clock Clk1 making a low-to-high transition during time interval 1 of the $(n+2)^{th}$ sampling cycle, an input charge packet having +2 charge units and a reference charge packet having −3 charge units are generated and combined simultaneously at input node 110 of amplifier 112. A sum charge packet of −1 charge unit is thus created and accumulated by integrator 101 onto capacitor Caccum. When the charge associated with the sum charge packet having one negative charge unit is accumulated, the charge at capacitor Caccum decreases by one charge unit from a +0.5 charge units to −0.5 charge units. The voltage at integ_out (node 114) increases by one voltage unit from −0.5 voltage units to +0.5 voltage units.

At the $(n+3)^{th}$ sampling cycle, comparator 120 reads an integ_out_neg value (−0.5 voltage units) that is less than $V_{Ref1}$, digital_out transitions to a logical "0" value in response to clock Clk2. Then, an input charge packet is generated at time interval 1 in response to the rising edge of clock Clk1. A reference charge packet is not generated as a result of digital_out signal being at a logical "0" value. Thus, the input charge packet having positive two charge units is accumulated by integrator 101 onto capacitor Caccum. When the charge associated with the input charge packet having two positive charge units is accumulated, the charge at capacitor Caccum increases by two charge units from −0.5 charge units to +1.5 charge units. The voltage at integ_out (node 114) decreases by two voltage units from +0.5 voltage units to −1.5 voltage units.

At the $(n+4)^{th}$ sampling cycle, comparator 120 reads an integ_out_neg value (+1.5 voltage units) that is greater than $V_{Ref1}$, digital_out transitions to a logical "1" value in response to clock Clk2. An input charge packet is generated at time interval 1 in response to the rising edge of clock Clk1. A reference charge packet is generated as a result of digital_out signal being at a logical "1" value. Thus, a sum charge packet of −1 charge unit is formed at node 110 and accumulated by integrator 101 onto capacitor Caccum. When the charge associated with the sum charge packet having one negative charge unit is accumulated, the charge at capacitor Caccum decreases by one charge unit from +1.5 charge units to +0.5 charge units. The voltage at integ_out (node 114) increases by one voltage unit from −1.5 voltage units to −0.5 voltage units.

At the $(n+5)^{th}$ sampling cycle, comparator 120 reads an integ_out_neg value (+0.5 voltage units) that is greater than $V_{Ref1}$, digital_out signal remains at a logical "1" value in response to clock Clk2. An input charge packet is generated at time interval 1 in response to the rising edge of clock Clk1. A reference charge packet is generated as a result of digital_out signal being at a logical "1" value. Thus, a sum charge packet of −1 charge unit is formed at node 110 and accumulated by integrator 101 onto capacitor Caccum. When the charge associated with the sum charge packet having one negative charge unit is accumulated, the charge at capacitor Caccum decreases by one charge unit from +0.5 charge units to −0.5 charge units. The voltage at integ_out (node 114) increases by one voltage unit from −0.5 voltage units to +0.5 voltage units.

As shown by the operation of sampling cycles n+1 to n+5, modulation system 200 implements data dependent charge balancing where the reference charge packet is generated in a data dependent manner depending on the value of the digital_out signal. The reference charge packet, when provided, is combined with the input charge packet so that the sum of the input charge packet and the reference charge packet is accumulated by the integrator of the modulation system.

The above detailed descriptions are provided to illustrate specific embodiments of the present invention and are not intended to be limiting. Numerous modifications and variations within the scope of the present invention are possible. The present invention is defined by the appended claims.

I claim:

1. A modulation system generating and receiving an analog input signal from an input sensor, said modulation system comprising:

a switched excitation circuit coupled to excite said input sensor for generating an input voltage step;

an integrator receiving said input voltage step through AC coupling and receiving a reference charge packet generated in response to a data dependent signal, said integrator integrating a charge indicative of the sum of an input charge associated with said input voltage step AC coupled to said integrator and said reference charge packet, said input charge and said reference charge packet having reverse polarities, and said integrator generating an integrator output signal; and a comparator having an input terminal coupled to receive a signal corresponding to said integrator output signal and comparing said integrator output signal to a reference level to generate a digital output signal at an output terminal, said data dependent signal having a value corresponding to said digital output signal, wherein said data dependent signal causes said reference charge packet to be generated synchronously with the excitation of said input sensor when said data dependent signal has a first value and causes no reference charge packet to be generated when said data dependent signal has a second value; and wherein said digital output signal forms a digital data stream over a plurality of sampling cycles, said digital data stream having an ones density proportional to a magnitude of said input voltage step.

2. The modulation system of claim 1, wherein said integrator comprises an input capacitor coupled to an amplifier, such that when said integrator is operated in a correlated double sampling mode, said amplifier is shorted out to store an amplifier error voltage onto said input capacitor.

3. The modulation system of claim 1, wherein said comparator further comprises a second input terminal coupled to receive a reference voltage as said reference level.

4. The modulation system of claim 1, wherein said reference charge packet is generated in response to said data dependent signal and based on a first voltage, said input charge being associated with a rising edge of said input voltage step and said reference charge packet being associated with a falling edge of said first voltage, said integrator integrates charges associated with said input charge having positive magnitude when no reference charge packet is applied or integrates charges associated with the sum of said input charge having positive magnitude and said reference charge packet having negative magnitude when said reference charge packet is applied.

5. The modulation system of claim 1, wherein said reference charge packet is generated in response to said data dependent signal and based on a first voltage, said input charge being associated with a falling edge of said input voltage step and said reference charge packet being associated with a rising edge of said first voltage, said integrator integrates charges associated with said input charge having negative magnitude when no reference charge packet is applied or integrates charges associated with the sum of said input charge having negative magnitude and said reference charge packet having positive magnitude when said reference charge packet is applied.

6. A modulation system generating and receiving an analog input signal from an input sensor, said modulation system comprising:
- a switched excitation circuit coupled to excite said input sensor for generating an input voltage step;
- an integrator coupled to sample said input voltage step synchronously with the excitation of said input sensor and to generate an integrator output signal, said integrator comprising:
  - an input capacitor having a first terminal coupled to said input sensor and a second terminal, said input voltage step being AC coupled through said input capacitor to form an input charge corresponding to the magnitude of said input voltage step;
  - an amplifier having a first input terminal coupled to said second terminal of said input capacitor and an output terminal;
  - an accumulation capacitor having a first terminal coupled to said first input terminal of said amplifier and a second terminal providing said integrator output signal;
  - a first switch coupled between said first input terminal and said output terminal of said amplifier, said first switch being controlled by a first clock signal;
  - a second switch coupled between said second terminal of said accumulation capacitor and said output terminal of said amplifier, said second switch being controlled by a second clock signal being complementary to the first clock signal; and
- a charge packet generator circuit generating a reference charge packet in response to a data dependent signal and synchronously with the excitation of said input sensor, said reference charge packet having a polarity reverse to that of said input charge, said reference charge packet being coupled to said first input terminal of said amplifier; and
- a comparator having an input terminal coupled to receive a signal corresponding to said integrator output signal and comparing said integrator output signal to a reference level to generate an output signal at an output terminal, said data dependent signal having a value corresponding to said output signal of said comparator, wherein said data dependent signal causes said reference charge packet to be generated synchronously with the excitation of said input sensor when said data dependent signal has a first value and causes no reference charge packet to be generated when said data dependent signal has a second value; and wherein said output signal forms a digital data stream over a plurality of sampling cycles, said digital data stream having an ones density proportional to a magnitude of said input voltage step.

7. The modulation system of claim 6, wherein said first switch is closed and said second switch is open to operate said integrator in a correlated double sampling mode for enabling said amplifier to store an amplifier error voltage onto said input capacitor.

8. The modulation system of claim 7, wherein said amplifier error voltage comprises an amplifier offset voltage, 1/f noise and wideband amplifier noise, and wherein said correlated double sampling mode operates to cancel essentially all of said amplifier offset voltage, said 1/f noise, and partially cancel said wideband amplifier noise.

9. The modulation system of claim 6, wherein said integrator further comprises a buffer having an input terminal coupled to said second terminal of said accumulation capacitor and an output terminal coupled to said input terminal of said comparator, said comparator receiving an input signal corresponding to said integrator output signal.

10. The modulation system of claim 9, wherein said buffer comprises an inverting buffer having a gain of –K.

11. The modulation system of claim 6, further comprising:
- a logic circuit for generating said data dependent signal, said logic circuit receiving an input signal corresponding to said output signal and a third clock signal,
- wherein said third clock signal is also coupled to drive said switched excitation circuit so that said reference charge packet, when applied, is generated synchronously with the excitation of said input sensor.

12. The modulation system of claim 6, wherein said integrator integrates a charge indicative of the sum of said input charge and said reference charge packet, said charge indicative of said sum being stored on said accumulation capacitor in said integrator.

13. The modulation system of claim 6, wherein said amplifier comprises an operational amplifier having an inverting input terminal being said first input terminal, a non-inverting input terminal coupled to a ground or reference potential and an output terminal being said output terminal of said amplifier.

14. The modulation system of claim 6, wherein said comparator further comprises a second input terminal coupled to receive a reference voltage as said reference level.

15. The modulation system of claim 6, wherein each of said first switch and said second switch comprises a self-bootstrapping constant on-resistance switch circuit.

16. The modulation system of claim 6, wherein said reference charge packet is generated in response to said data dependent signal and based on a first voltage, said input charge being associated with a rising edge of said input voltage step and said reference charge packet being associated with a falling edge of said first voltage, said integrator integrates charges associated with said input charge having positive magnitude when no reference charge packet is applied or integrates charges associated with the sum of said input charge having positive magnitude and said reference charge packet having negative magnitude when said reference charge packet is applied.

17. The modulation system of claim 6, wherein said reference charge packet is generated in response to said data dependent signal and based on a first voltage, said input charge being associated with a falling edge of said input voltage step and said reference charge packet being associated with a rising edge of said first voltage, said integrator integrates charges associated with said input charge having negative magnitude when no reference charge packet is applied or integrates charges associated with the sum of said input charge having negative magnitude and said reference charge packet having positive magnitude when said reference charge packet is applied.

18. The modulation system of claim 6, wherein said switched excitation circuit comprises a switched current circuit.

19. The modulation system of claim 6, wherein said switched excitation circuit comprises a switched voltage circuit.

20. A modulator receiving an input voltage step from an input sensor, said modulator comprising:
   an integrator coupled to sample said input voltage step synchronously with the excitation of said input sensor and to generate an integrator output signal, said integrator comprising:
      an input capacitor having a first terminal coupled to said input sensor and a second terminal, said input voltage step being AC coupled through said input capacitor to form an input charge corresponding to the magnitude of said input voltage step;
      an amplifier having a first input terminal coupled to said second terminal of said input capacitor and an output terminal;
      an accumulation capacitor having a first terminal coupled to said first input terminal of said amplifier and a second terminal providing said integrator output signal;
      a first switch coupled between said first input terminal and said output terminal of said amplifier, said first switch being controlled by a first clock signal;
      a second switch coupled between said second terminal of said accumulation capacitor and said output terminal of said amplifier, said second switch being controlled by a second clock signal being complementary to the first clock signal; and
      a charge packet generator circuit generating a reference charge packet in response to a data dependent signal and synchronously with the excitation of said input sensor, said reference charge packet having a polarity reverse to that of said input charge, said reference charge packet being coupled to said first input terminal of said amplifier; and
   a comparator having an input terminal coupled to receive a signal corresponding to said integrator output signal, said comparator comparing said integrator output signal to a reference level to generate an output signal at an output terminal, said data dependent signal having a value corresponding to said output signal of said comparator,
   wherein said data dependent signal causes said reference charge packet to be generated synchronously with the excitation of said input sensor when said data dependent signal has a first value and causes no reference charge packet to be generated when said data dependent signal has a second value; and
   wherein said output signal forms a digital data stream over a plurality of sampling cycles, said digital data stream having an ones density proportional to a magnitude of said input voltage step.

21. The modulator of claim 20, wherein said first switch is closed and said second switch is open to operate said integrator in a correlated double sampling mode for enabling said amplifier to store an amplifier error voltage onto said input capacitor.

22. The modulator of claim 20, further comprising:
   a logic circuit for generating said data dependent signal, said logic circuit receiving an input signal corresponding to said output signal and a third clock signal,
   wherein said third clock signal is synchronous with the excitation of said input sensor so that said reference charge packet, when applied, is generated at the same time as said input voltage step.

23. The modulator of claim 20, wherein said integrator integrates a charge indicative of the sum of said input charge and said reference charge packet, said charge indicative of said sum being stored on said accumulation capacitor in said integrator.

24. The modulator of claim 20, wherein said reference charge packet is generated in response to said data dependent signal and based on a first voltage, said input charge being associated with a rising edge of said input voltage step and said reference charge packet being associated with a falling edge of said first voltage, said integrator integrates charges associated with said input charge having positive magnitude when no reference charge packet is applied or integrates charges associated with the sum of said input charge having positive magnitude and said reference charge packet having negative magnitude when said reference charge packet is applied.

25. The modulator of claim 20, wherein said reference charge packet is generated in response to said data dependent signal and based on a first voltage, said input charge being associated with a falling edge of said input voltage step and said reference charge packet being associated with a rising edge of said first voltage, said integrator integrates charges associated with said input charge having negative magnitude when no reference charge packet is applied or integrates charges associated with the sum of said input charge having negative magnitude and said reference charge packet having positive magnitude when said reference charge packet is applied.

26. The modulator of claim 20, wherein said amplifier comprises an operational amplifier having an inverting input terminal being said first input terminal, a non-inverting input terminal coupled to a ground or reference potential and an output terminal being said output terminal of said amplifier.

27. The modulator of claim 20, wherein said comparator further comprises a second input terminal coupled to receive a reference voltage as said reference level.

28. A method for sampling and digitizing an analog input data source from an input sensor, comprising:
- applying a switched excitation source to said input sensor;
- generating an input voltage step at said input sensor as a result of said application of said switched excitation source;
- AC coupling said input voltage step to an integrator to form an input charge;
- generating a data dependent signal having a first value and a second value;
- generating a reference charge packet synchronously with said input voltage step when said data dependent signal has said first value;
- coupling said reference charge packet to said integrator;
- integrating charges corresponding to the sum of said input charge and said reference charge packet onto an accumulation capacitor, said input charge and said reference charge packet having reverse polarities;
- comparing a signal corresponding to said charges accumulated on said accumulation capacitor with a reference voltage level; and
- generating an output signal as a result of said comparing, said data dependent signal having said first value and said second value corresponding to respective logical levels of said output signal,
- wherein after a plurality of sampling cycles, said output signal forms a digital data stream having an ones density proportional to a magnitude of said input voltage step.

29. The method of claim 28, further comprising:
- in response to a first clock signal deactivating said integrator and operating said integrator in a correlated double sampling mode, said deactivating and operating comprising:
  - shorting out an amplifier in said integrator; and
  - storing an amplifier error voltage onto an input capacitor of said integrator, said amplifier error voltage comprising an amplifier offset voltage, 1/f noise and wideband amplifier noise.

30. The method of claim 28, wherein said comparing comprises:
- coupling an inverting buffer to said accumulation capacitor;
- generating at an output terminal of said inverting buffer a voltage corresponding to an inverted voltage value corresponding to said charges accumulated on said accumulation capacitor; and
- comparing said voltage at said output terminal of said inverting buffer with said reference voltage level.

31. The method of claim 28, wherein said AC coupling said input voltage step to an integrator comprises:
- coupling said input voltage step to a first terminal of an input capacitor of said integrator;
- coupling a second terminal of said input capacitor to an input terminal of an amplifier and a first terminal of said accumulation capacitor, said accumulation capacitor being coupled between said input terminal and an output terminal of said integrator.

32. The method of claim 28, wherein AC coupling said input voltage step to an integrator to form an input charge comprises AC coupling a rising edge of said input voltage step for forming a positive input charge; and wherein generating a reference charge packet synchronously with said input voltage step comprises generating a negative reference charge packet based on a falling edge of a first voltage.

33. The method of claim 28, wherein AC coupling said input voltage step to an integrator to form an input charge comprises AC coupling a falling edge of said input voltage step for forming a negative input charge; and wherein generating a reference charge packet synchronously with said input voltage step comprises generating a positive reference charge packet based on a rising edge of a first voltage.

* * * * *